(12) United States Patent
Drzaic et al.

(10) Patent No.: US 7,030,412 B1
(45) Date of Patent: Apr. 18, 2006

(54) MINIMALLY-PATTERNED SEMICONDUCTOR DEVICES FOR DISPLAY APPLICATIONS

(75) Inventors: Paul S. Drzaic, Lexington, MA (US); Karl R. Amundson, Cambridge, MA (US); Gregg M. Duthaler, Brookline, MA (US); Peter T. Kazlas, Sudbury, MA (US); Yu Chen, Cambridge, MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 09/565,413

(22) Filed: May 5, 2000

Related U.S. Application Data

(60) Provisional application No. 60/132,642, filed on May 5, 1999.

(51) Int. Cl.
*H01L 29/04* (2006.01)
(52) U.S. Cl. .......................................... 257/59; 257/72
(58) Field of Classification Search ........ 438/149–166, 438/FOR. 201, FOR. 184; 257/347, 348, 257/349, 350, 52, 55, 57, 66, 59, 60, 67, 257/69, 70, 77, E29.151, E51.005; 349/42–45; 345/90, 92
See application file for complete search history.

(56) References Cited

U.S. PATENT DOCUMENTS

| | | |
|---|---|---|
| 3,036,388 A | 5/1962 | Tate |
| 3,384,488 A | 5/1968 | Tulagin et al. |
| 3,612,758 A | 10/1971 | Evans et al. |
| 3,670,323 A | 6/1972 | Sobel et al. |
| 3,767,392 A | 10/1973 | Ota |
| 3,792,308 A | 2/1974 | Ota |
| 3,806,893 A | 4/1974 | Ohnishi et al. |
| 3,850,627 A | 11/1974 | Wells et al. |
| 3,972,040 A | 7/1976 | Hilsum et al. |
| 4,041,481 A | 8/1977 | Sato |
| 4,045,327 A | 8/1977 | Noma et al. |
| 4,068,927 A | 1/1978 | White |
| 4,071,430 A | 1/1978 | Liebert |
| 4,088,395 A | 5/1978 | Gigila |
| 4,123,346 A | 10/1978 | Ploix |
| 4,149,149 A | 4/1979 | Miki et al. |
| 4,203,106 A | 5/1980 | Dalisa et al. |
| 4,218,302 A | 8/1980 | Dalisa et al. |
| 4,261,653 A | 4/1981 | Goodrich |
| 4,305,807 A | 12/1981 | Somlyody |
| 4,311,361 A | 1/1982 | Somlyody |

(Continued)

FOREIGN PATENT DOCUMENTS

DE  44 31 441 C1  2/1996

(Continued)

OTHER PUBLICATIONS

Blazo, "10.1/9:00 A.M.: High Resolution Electrophoretic Display with Photoconductor Addressing," *SID 82 DIGEST*, 1982, (pp. 92-93).

(Continued)

*Primary Examiner*—Brook Kebede
(74) *Attorney, Agent, or Firm*—David J. Cole

(57) ABSTRACT

A thin-film transistor array comprises at least first and second transistors. Each transistor comprises a source electrode, a drain electrode a semiconductor electrode, a gate electrode, and a semiconductor layer. The semiconductor layer is continuous between the first and second transistors. The semiconductor layer is preferably unpatterned. In various display applications, the geometry of the transistors is selected to provide acceptable leakage currents. In a preferred embodiment, the transistor array is employed in an encapsulated electrophoretic display.

15 Claims, 11 Drawing Sheets

U.S. PATENT DOCUMENTS

| | | | |
|---|---|---|---|
| 4,324,456 A | 4/1982 | Dalissa | |
| 4,390,403 A | 6/1983 | Batchelder | |
| 4,418,346 A | 11/1983 | Batchelder | |
| 4,430,648 A | 2/1984 | Togashi et al. | |
| 4,439,507 A | 3/1984 | Pan et al. | |
| 4,450,440 A | 5/1984 | White | |
| 4,502,934 A | 3/1985 | Gazard et al. | |
| 4,522,472 A | 6/1985 | Liebert et al. | |
| 4,543,306 A | 9/1985 | Dubois et al. | |
| 4,598,960 A | 7/1986 | DiSanto et al. | |
| 4,643,528 A | 2/1987 | Bell, Jr. | |
| 4,648,956 A | 3/1987 | Marshall et al. | |
| 4,655,897 A | 4/1987 | DiSanto et al. | |
| 4,686,524 A | 8/1987 | White | |
| 4,732,830 A | 3/1988 | DiSanto et al. | |
| 4,741,604 A | 5/1988 | Kornfeld | |
| 4,742,345 A | 5/1988 | DiSanto et al. | |
| 4,746,917 A | 5/1988 | DiSanto et al. | |
| 4,833,464 A | 5/1989 | DiSanto et al. | |
| 4,846,931 A | 7/1989 | Gmitter et al. | |
| 4,850,919 A | 7/1989 | DiSanto et al. | |
| 4,883,561 A | 11/1989 | Gmitter et al. | |
| 4,892,607 A | 1/1990 | DiSanto et al. | |
| 4,931,019 A | 6/1990 | Park | |
| 4,947,159 A | 8/1990 | DiSanto et al. | |
| 5,009,490 A | 4/1991 | Kouno et al. | |
| 5,028,841 A | 7/1991 | DiSanto et al. | |
| 5,041,824 A | 8/1991 | DiSanto et al. | |
| 5,053,763 A | 10/1991 | DiSanto et al. | |
| 5,066,105 A | 11/1991 | Yoshimoto et al. | |
| 5,066,946 A | 11/1991 | DiSanto et al. | |
| 5,070,326 A | 12/1991 | Yoshimoto et al. | |
| 5,077,157 A | 12/1991 | DiSanto et al. | |
| 5,105,185 A | 4/1992 | Nakanowatari et al. | |
| 5,128,226 A | 7/1992 | Hung | |
| 5,128,785 A | 7/1992 | Yoshimoto et al. | |
| 5,161,007 A | 11/1992 | Takanashi et al. | |
| 5,174,882 A | 12/1992 | DiSanto et al. | |
| 5,177,476 A | 1/1993 | DiSanto et al. | |
| 5,187,609 A | 2/1993 | DiSanto et al. | |
| 5,194,852 A | 3/1993 | More et al. | |
| 5,216,416 A | 6/1993 | DiSanto et al. | |
| 5,220,316 A | 6/1993 | Kazan | |
| 5,223,115 A | 6/1993 | DiSanto et al. | |
| 5,223,823 A | 6/1993 | DiSanto et al. | |
| 5,238,861 A | 8/1993 | Morin et al. | |
| 5,247,290 A | 9/1993 | DiSanto et al. | |
| 5,250,932 A | 10/1993 | Yoshimoto et al. | |
| 5,250,938 A | 10/1993 | DiSanto et al. | |
| 5,254,981 A | 10/1993 | DiSanto et al. | |
| 5,266,937 A | 11/1993 | DiSanto et al. | |
| 5,270,843 A | 12/1993 | Wang | |
| 5,273,920 A * | 12/1993 | Kwasnick et al. | 438/158 |
| 5,276,438 A | 1/1994 | DiSanto et al. | |
| 5,279,694 A | 1/1994 | DiSanto et al. | |
| 5,293,528 A | 3/1994 | DiSanto et al. | |
| 5,296,974 A | 3/1994 | Tada et al. | |
| 5,302,235 A | 4/1994 | DiSanto et al. | |
| 5,303,073 A | 4/1994 | Shirota et al. | |
| 5,304,439 A | 4/1994 | Disanto et al. | |
| 5,315,312 A | 5/1994 | DiSanto et al. | |
| 5,345,251 A | 9/1994 | DiSanto et al. | |
| 5,359,346 A | 10/1994 | DiSanto et al. | |
| 5,362,671 A | 11/1994 | Zavracky et al. | |
| 5,383,008 A | 1/1995 | Sheridon | |
| 5,389,945 A | 2/1995 | Sheridon | |
| 5,402,145 A | 3/1995 | DiSanto et al. | |
| 5,403,772 A | 4/1995 | Zhang et al. | |
| 5,412,398 A | 5/1995 | DiSanto et al. | |
| 5,460,688 A | 10/1995 | DiSanto et al. | |
| 5,462,887 A * | 10/1995 | Gluck | 438/158 |
| 5,463,492 A | 10/1995 | Check, III | |
| 5,467,107 A | 11/1995 | DiSanto et al. | |
| 5,499,038 A | 3/1996 | DiSanto et al. | |
| 5,508,720 A | 4/1996 | DiSanto et al. | |
| 5,545,291 A | 8/1996 | Smith et al. | |
| 5,561,443 A | 10/1996 | DiSanto et al. | |
| 5,565,885 A | 10/1996 | Tamanoi | |
| 5,569,610 A | 10/1996 | Zhang et al. | |
| 5,573,711 A | 11/1996 | Hou et al. | |
| 5,575,554 A | 11/1996 | Guritz | |
| 5,583,675 A | 12/1996 | Yamada et al. | |
| 5,602,572 A | 2/1997 | Rylander | |
| 5,609,978 A | 3/1997 | Giorgianni et al. | |
| 5,614,340 A | 3/1997 | Bugner et al. | |
| 5,623,585 A | 4/1997 | Matias et al. | |
| 5,625,199 A | 4/1997 | Baumbach et al. | |
| 5,627,561 A | 5/1997 | Laspina et al. | |
| 5,638,103 A | 6/1997 | Obata et al. | |
| 5,648,801 A | 7/1997 | Beardsley et al. | |
| 5,650,199 A | 7/1997 | Chang et al. | |
| 5,650,247 A | 7/1997 | Taniguchi et al. | |
| 5,650,872 A | 7/1997 | Saxe et al. | |
| 5,675,719 A | 10/1997 | Matias et al. | |
| 5,684,501 A | 11/1997 | Knapp et al. | |
| 5,686,383 A | 11/1997 | Long et al. | |
| 5,688,584 A | 11/1997 | Casson et al. | |
| 5,689,282 A | 11/1997 | Wolfs et al. | |
| 5,699,102 A | 12/1997 | Ng et al. | |
| 5,707,738 A | 1/1998 | Hou | |
| 5,714,051 A | 2/1998 | Van Leth et al. | |
| 5,715,511 A | 2/1998 | Aslam et al. | |
| 5,715,514 A | 2/1998 | Williams et al. | |
| 5,717,514 A | 2/1998 | Sheridon | |
| 5,718,996 A | 2/1998 | Iijima et al. | |
| 5,721,042 A | 2/1998 | Iijima et al. | |
| 5,725,935 A | 3/1998 | Rajan | |
| 5,729,663 A | 3/1998 | Lin et al. | |
| 5,731,116 A | 3/1998 | Matsuo et al. | |
| 5,737,115 A | 4/1998 | Mackinlay et al. | |
| 5,738,977 A | 4/1998 | Van Der Sluis-Van Der Voort et al. | |
| 5,739,801 A | 4/1998 | Sheridon | |
| 5,740,495 A | 4/1998 | Maher et al. | |
| 5,744,283 A | 4/1998 | Spierings et al. | |
| 5,750,238 A | 5/1998 | Iijima et al. | |
| 5,783,856 A | 7/1998 | Smith et al. | |
| 5,786,875 A | 7/1998 | Brader et al. | |
| 5,821,137 A | 10/1998 | Wakai et al. | |
| 5,824,186 A | 10/1998 | Smith et al. | |
| 5,892,244 A | 4/1999 | Tanaka et al. | |
| 5,892,504 A | 4/1999 | Knapp | |
| 5,904,545 A | 5/1999 | Smith et al. | |
| 5,930,026 A | 7/1999 | Jacobson et al. | |
| 5,936,259 A | 8/1999 | Katz et al. | |
| 5,961,804 A | 10/1999 | Jacobson et al. | |
| 5,969,376 A | 10/1999 | Bao | |
| 6,005,791 A | 12/1999 | Gudesen et al. | |
| 6,005,817 A | 12/1999 | Gudesen et al. | |
| 6,045,955 A | 4/2000 | Vincent | |
| 6,055,180 A | 4/2000 | Gudesen et al. | |
| 6,064,091 A * | 5/2000 | Deane et al. | 257/347 |
| 6,287,899 B1 * | 9/2001 | Park et al. | 438/149 |
| 6,303,943 B1 * | 10/2001 | Yu et al. | 257/40 |

FOREIGN PATENT DOCUMENTS

| | | |
|---|---|---|
| DE | 195 00 694 A1 | 8/1996 |
| EP | 0 186 710 A1 | 7/1986 |
| EP | 0 325 013 A1 | 7/1989 |
| EP | 0 325 013 B1 | 7/1989 |
| EP | 0 344 367 A1 | 12/1989 |
| EP | 0 344 367 B1 | 12/1989 |
| EP | 0 361 420 A2 | 4/1990 |
| EP | 0 362 928 A1 | 4/1990 |

| | | |
|---|---|---|
| EP | 0 363 030 A2 | 4/1990 |
| EP | 0 363 030 B1 | 4/1990 |
| EP | 0 396 247 A2 | 11/1990 |
| EP | 0 396 247 B1 | 11/1990 |
| EP | 0 404 545 A2 | 12/1990 |
| EP | 0 443 571 A2 | 8/1991 |
| EP | 0 448 853 A1 | 10/1991 |
| EP | 0 448 853 B1 | 10/1991 |
| EP | 0 460 747 A2 | 12/1991 |
| EP | 0 525 852 A1 | 2/1993 |
| EP | 0 525 852 B1 | 2/1993 |
| EP | 0 570 995 A1 | 11/1993 |
| EP | 0 570 995 B1 | 11/1993 |
| EP | 0 575 475 B1 | 12/1993 |
| EP | 0 586 373 B1 | 3/1994 |
| EP | 0 586 545 B1 | 3/1994 |
| EP | 0 595 812 B1 | 5/1994 |
| EP | 0 601 072 B1 | 6/1994 |
| EP | 0 601 075 B1 | 6/1994 |
| EP | 0 604 423 B1 | 7/1994 |
| EP | 0 618 715 A1 | 10/1994 |
| EP | 0 684 579 A2 | 11/1995 |
| EP | 0 685 101 B1 | 12/1995 |
| EP | 0 709 713 A2 | 5/1996 |
| EP | 0 924 551 A1 | 6/1999 |
| EP | 0 962 808 A2 | 12/1999 |
| EP | 1 024 540 A2 | 8/2000 |
| FR | 2 693 005 | 12/1993 |
| GB | 1 314 906 | 4/1973 |
| GB | 2 149 548 A | 6/1985 |
| GB | 2 306 229 A | 4/1997 |
| GB | 2 324 273 A | 10/1998 |
| JP | 54111368 | 8/1979 |
| JP | 55096922 | 7/1980 |
| JP | 62058222 | 3/1987 |
| JP | 62231930 | 10/1987 |
| JP | 64 86116 | 3/1989 |
| JP | 01086116 | 3/1989 |
| JP | 03053114 A | 3/1991 |
| JP | 3053224 | 3/1991 |
| JP | 3091722 | 4/1991 |
| JP | 03091722 A | 4/1991 |
| JP | 3096925 | 4/1991 |
| JP | 03096925 A | 4/1991 |
| JP | 5-61421 | 3/1993 |
| JP | 6089081 | 3/1994 |
| JP | 6-202168 | 7/1994 |
| JP | 07036020 | 2/1995 |
| JP | 08321621 | * 12/1996 |
| JP | 9-6277 | 1/1997 |
| JP | 9031453 A | 2/1997 |
| JP | 9-185087 | 7/1997 |
| JP | 09230391 | 9/1997 |
| JP | 10-48673 | 2/1998 |
| JP | 10072571 A | 3/1998 |
| JP | 10-149118 A | 6/1998 |
| JP | 10-161161 | 6/1998 |
| JP | 11202804 | 7/1999 |
| JP | 11212499 | 8/1999 |
| JP | 11219135 | 8/1999 |
| JP | 11264812 | 9/1999 |
| WO | WO 92/12453 | 7/1992 |
| WO | WO 92/17873 | 10/1992 |
| WO | WO 92/20060 | 11/1992 |
| WO | WO 92/21733 | 12/1992 |
| WO | WO 93/02443 | 2/1993 |
| WO | WO 93/04458 | 3/1993 |
| WO | WO 93/04459 | 3/1993 |
| WO | WO 93/05425 | 3/1993 |
| WO | WO 93/07608 | 4/1993 |
| WO | WO 93/17414 | 9/1993 |
| WO | WO 93/18428 | 9/1993 |
| WO | WO 94/19789 | 9/1994 |
| WO | WO 95/05622 | 2/1995 |
| WO | WO 95/06307 | 3/1995 |
| WO | WO 95/07527 | 3/1995 |
| WO | WO 95/10107 | 4/1995 |
| WO | WO 95/22085 | 8/1995 |
| WO | WO 96/41372 | 12/1996 |
| WO | WO 97/01165 | 1/1997 |
| WO | WO 97/01166 | 1/1997 |
| WO | WO 97/01171 | 1/1997 |
| WO | WO 97/04398 | 2/1997 |
| WO | WO 97/24907 | 7/1997 |
| WO | WO 97/35298 | 9/1997 |
| WO | WO 97/48009 | 12/1997 |
| WO | WO 97/49125 | 12/1997 |
| WO | WO 98/03896 | 1/1998 |
| WO | WO 98/19208 | 5/1998 |
| WO | WO 98/41898 | 9/1998 |
| WO | WO 98/55897 | 12/1998 |
| WO | WO 98/58383 | 12/1998 |
| WO | WO 99/10768 | 3/1999 |
| WO | WO 99/12170 | 3/1999 |
| WO | WO 99/20682 | 4/1999 |
| WO | WO 99/26419 | 5/1999 |
| WO | WO 99/40631 | 8/1999 |
| WO | WO 99/41732 | 8/1999 |
| WO | WO 99/41787 | 8/1999 |
| WO | WO 99/41788 | 8/1999 |
| WO | WO 99/44229 | 9/1999 |
| WO | WO 99/45416 | 9/1999 |
| WO | WO 99/45582 | 9/1999 |
| WO | WO 99/47970 | 9/1999 |
| WO | WO 99/53371 | 10/1999 |
| WO | WO 99/56171 | 11/1999 |
| WO | WO 99/63527 | 12/1999 |
| WO | WO 99/65011 | 12/1999 |
| WO | WO 99/65012 | 12/1999 |

OTHER PUBLICATIONS

Bohnke et al., "Polymer-Based Solid Electrochronic Cell for Matrix-Addressable Display Devices," *J. Electrochem Soc.*, Dec. 1991, vol. 138, No. 12, (pp. 3612-3617).

Chiang et al., "11.5/4:10 P.M.: A High Speed Electrophoretic Matrix Display," *SID 80 Digest*, 1980, (pp. 114-115).

Dalisa, "Electrophoretic Display Technology," *Transactions on Electron Devices*, Jul. 1977, vol. 24, No. 7, (pp. 827-834).

Hosaka et al., "Electromagnetic Microrelays: Concepts and Fundamental Characteristics," *Sensors and Actuators*, 1994, vol. 40, (pp. 41-47).

Kornfield, "9.5: A Defect-Tolerant Active-Matrix Electrophoretic Display," *SID 84 Digest*, 1984, (pp. 142-144).

Moesner et al., "Devices for Particle Handling by an AC Electric Field," *Proceedings of the IEEE*, 1995, (pp. 66-71).

Murau, "9.4: Characteristics of an X-Y Addressed Electrophoretic Image Display (EPID)," *SID 84 Digest*, 1984, (p. 141).

Vaz et al., "Dual Frequency Addressing of Polymer-Dispersed Liquid-Crystal Films," *J. Appl. Phys.*, Jun. 1989, vol. 65, No. 12, (pp. 5043-5050).

Ota et al., "Developments in Electrophoretic Displays," *Proceedings of the SID*, 1977, vol. 18, Nos. 3 & 4, (pp. 243-254).

Ota et al., "Electrophoretic Display Devices," *Laser 75 Optoelectronics Conference Proceedings*, (pp. 145-148).

Ota et al., "Electrophoretic Image Display," *Proceedings of the IEEE*, Jul. 1973, (pp. 832-836).

Pankove, "Color Reflection Types Display Panel," *RCA Technical Notes*, Mar. 1962, No. 535, (2 sheets).

Saitoh et al., "A Newly Developed Electrical Twisting Ball Display," *Proceedings of the SID*, 1982 vol. 23, No. 4, (pp. 249-253).

Sheridon et al., "10.2/9:25 A.M.: A Photoconductor-Addressed Electrophoretic Cell for Office Data Display," *SID 82 Digest*, 1982, (pp. 94-95).

Shiffman et al., "An Electrophoretic Display with Internal NMOS Address Logic and Display Drivers," *Proceedings of the SID*, 1984, vol. 25, No. 2, (pp. 105-115).

Shiwa et al., "5.6: Electrophoretic Display Method Using Ionographic Technology," *SID 88 Digest*, 1988, (pp. 61-62).

Singer et al., "An X-Y Addressable Electrophoretic Display," *Proceeding of the SID*, 1977, vol. 18, Nos. 3 & 4, (pp. 255-266).

Vance, "Optical Characteristics of Electrophoretic Displays," *Proceeding of the SID*, 1977, vol. 18, Nos. 3 & 4, (pp. 267-274).

Yamaguchi et al., "Equivalent Circuit of Ion Projection-Driven Electrophoretic Display," *IEICE Transactions*, 1991, vol. 74, No. 12, (4152-4156).

Comiskey et al., "An Electrophoretic Ink for All-Printed Reflective Electronic Displays," *Nature*, Jul. 1998, vol. 394, (pp. 253-255).

Hopper et al., (1979), "An Electrophoretic Display, Its Properties, Model and Addressing," *Transaction on Electron Devices*, 26(8):1148-1152.

White, "An Electrophoretic Bar Graph Display," *Proceedings of the SID*, 1981, 22(3):173-180.

Antia (1999), "Switchable Reflections Make Electronic Ink", *Science*, 285:658.

Quon, S. (1977), "Multilevel Voltage Selective (MLVS): A Novel Technique to X-Y Address an Electrophoretic Image Display," *Correspondence* 1120-1123.

Chiang, "A Stylus Writable Electrophoretic Display Device," SID 79 Digest, pp. 44-45.

Nakamura et al., Development of Electrophoretic Display Using Microencapsulated Suspension, 1998 ISD International Symposium Digest of Technical Papers—vol. 29, Proceedings of SID '98 International Symposium, Anaheim, CA, USA, May 1998, pp. 1014-1017.

Ridley et al., "All-Inorganic Field Effect Transistors Fabricated by Printing," Science, Oct. 22, 1999, vol. 286, pp. 746-748.

Dabbousi et al., "Electroluminescence from CdSe quantum-dot/polymer composites," Appl. Phys. Lett., Mar. 1995, vol. 66 (11), 13, pp. 1316-1318.

Huang et al., "Photoluminescence and Electroluminescence of ZnS:Cu nanocrystals in polymeric networks," Appl. Phys. Lett., May 5, 1997, vol. 70, No. 18, pp. 2335-2337.

Drzaic et al., "A Printed and Rollable Bistable Electronic Display," 1998 SID International Symposium, Digest of Technical Papers, 1998, vol. 29, pp. 1131-1134.

\* cited by examiner

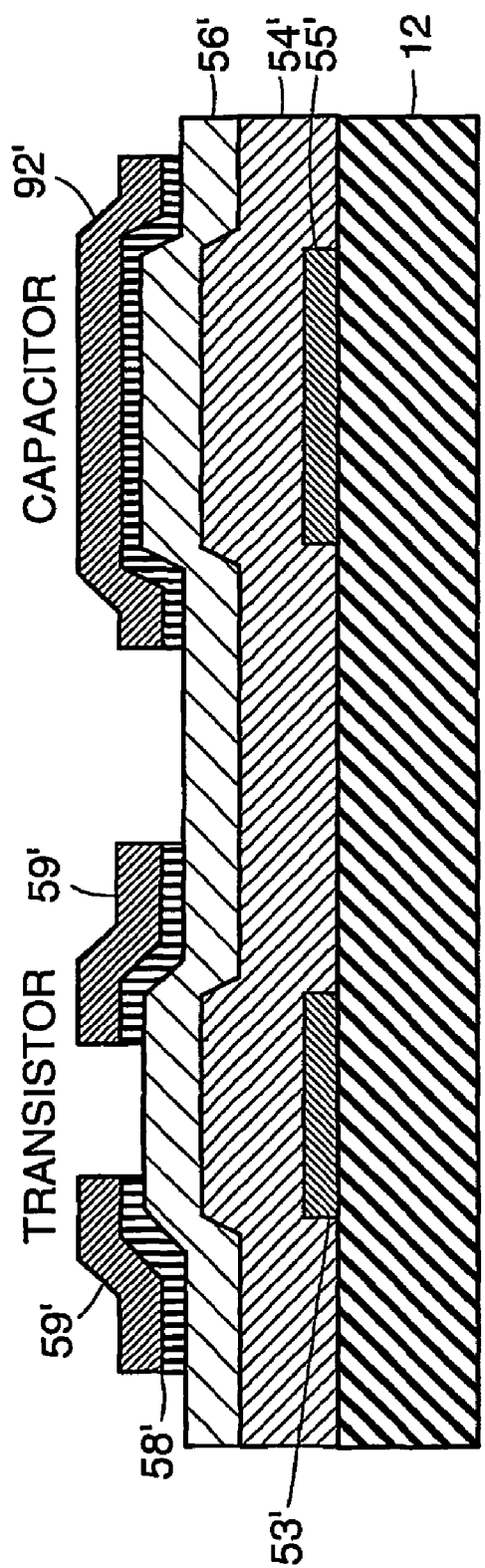

MINIMALLY-PATTERNED SEMICONDUCTOR DEVICES FOR DISPLAY APPLICATIONS

RELATED APPLICATIONS

This application claims priority to provisional application U.S. Ser. No. 60/132,642 filed on May 5, 1999, the entire contents of which are incorporated herein by reference.

FIELD OF THE INVENTION

The present invention relates generally to electronic displays and methods of manufacturing the electronic displays, and more particularly to, semiconductor devices for electronic display applications and methods of manufacturing the semiconductor devices.

BACKGROUND OF THE INVENTION

Encapsulated, particle-based displays offer a useful means of creating electronic displays. There exist many versions of encapsulated particle-based displays including encapsulated electrophoretic displays, encapsulated suspended particle displays, and rotating ball displays.

Encapsulated, particle-based displays can be made highly reflective, bistable, and optically and electrically efficient. To obtain a high-resolution display, however, individual pixels of a display must be addressable without interference from adjacent pixels. One way to achieve this objective is to provide an array of nonlinear elements, such as transistors or diodes where each transistor or diode is associated with each pixel. An addressing electrode is connected to each pixel through the transistor or the diode.

The processes for manufacturing active matrix arrays of thin-film transistors and diodes are well established in the display technology. Thin-film transistors, for example, can be fabricated using various deposition and photolithography techniques. A transistor includes a gate electrode, an insulating dielectric layer, a semiconductor layer and source and drain electrodes. Application of a voltage on the gate electrode provides an electric field across the semiconductor layer, which dramatically increases the source-to-drain conductivity of the semiconductor layer. This change allows for electrical conduction between the source and the drain electrodes. The gate electrode, the source electrode, and the drain electrode are typically patterned. In general, the semiconductor layer and the gate dielectric layer are also patterned in order to minimize stray conduction (i.e., cross-talk) between neighboring circuit elements. Following these steps, thin-film transistors can be fabricated to provide high performance. These processes, however, can result in significant cost.

The high cost in manufacturing thin-film transistors results in part from the patterning steps, which require the use of expensive masks in photolithographic setups, and etching steps. Trends toward making higher performance devices make precision patterning even more important and manufacturing cost even greater.

Certain electronic devices, however, do not require high performance while cost remains very important. For such devices, it remains desirable to have means to obtain better yield and lower of cost of manufacturing.

SUMMARY OF THE INVENTION

In one aspect, the invention features electronic circuits that have a lower manufacturing cost and, in another aspect, the invention features a method of making electronic circuits that involves simpler processing steps. The circuits have application, in particular, in display devices. In a preferred embodiment, the circuits comprise thin-film transistors where the semiconductor layer that mediates current between source and drain is continuous. In a preferred embodiment, the semiconductor layer is unpatterned. Optionally, the circuits can include an unpatterned dielectric layer.

In one alternative embodiment, the spacing between transistors is selected to obtain acceptable leakage currents. The geometry of the transistors can be selected to obtain an acceptable leakage current between a first data line and a second data line. Alternatively, the spacing between the first data line and a first pixel electrode can be chosen to provide an acceptable leakage current between the first data line and the first pixel electrode.

In one aspect, a thin-film transistor array comprises at least first and second transistors, where each of the transistors comprise: a source electrode; a drain electrode spaced from the source electrode; a semiconductor layer in electrical communication with both the source and drain electrodes; and a gate electrode disposed adjacent to the semiconductor layer such that the resistance of the semiconductor layer between the source and drain electrodes can be varied by varying a potential of the gate electrode. The semiconductor layer extends continuously from the first transistor to the second transistor.

In another aspect, an electronic display comprises: a display medium; a first pixel electrode and a second pixel electrode provided adjacent to the display medium; a first electronic device in electrical communication with the first pixel electrode and a second electronic device in electrical communication with the second pixel electrode, the first electronic device comprising a first electrode and the second electronic device comprising a second electrode; and a semiconductor layer in electrical communication with the first electrode and the second electrode, where the semiconductor layer extends continuously from the first electrode to the second electrode.

In still another aspect, an array of thin-film transistors that comprises at least a first transistor and a second transistor is manufactured by a method that comprises the steps of: providing a substrate; forming an unpatterned semiconductor layer, the semiconductor layer adjacent to the substrate; forming at least one patterned drain electrode for each of the transistors, the drain electrodes in electrical communication with the semiconductor layer; forming at least one patterned source electrode for each of the transistors, the source electrodes in electrical communication with the semiconductor layer; and forming at least one gate electrode for each of the transistors, the gate electrode disposed adjacent to the semiconductor layer such that the resistance of the semiconductor layer between the source and drain electrodes of one of the transistors can be varied by varying the potential of the gate electrode.

BRIEF DESCRIPTION OF THE DRAWINGS

The foregoing and other objects, features and advantages of the present invention, as well as the invention itself, will be more fully understood from the following description of preferred embodiments, when read together with the accompanying drawings, in which:

FIG. 4b shows a diagrammatic cross sectional view that corresponds to the transistor embodiment shown in FIG. 4a.

FIG. 5 shows a graph of drain current versus gate voltage for a sample of a two-mask transistor of the type shown in FIG. 4a.

DETAILED DESCRIPTION OF PREFERRED EMBODIMENTS

Figure 1:
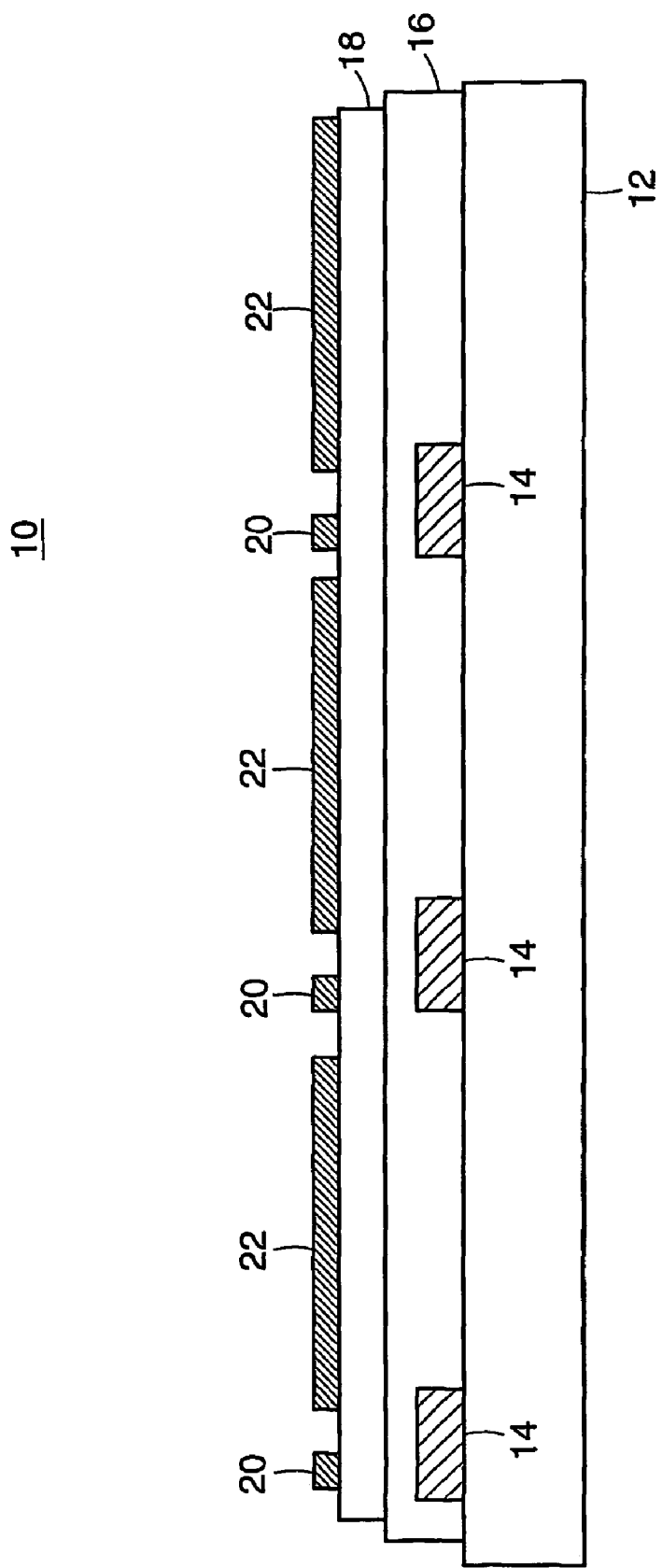
FIG. 1 shows a cross-sectional view of an array of thin-film transistors according to one embodiment of the present invention.

In one aspect, the invention features minimally-patterned semiconductor devices for display applications. In a preferred embodiment, the semiconductor devices are an array of thin-film transistors. Referring to FIG. 1, an array of transistors 10 include a substrate 12, a gate electrode 14 for each transistor provided adjacent to the substrate 12, a gate dielectric layer 16 provided adjacent to the substrate 12 and the gate electrodes 14, a semiconductor layer 18 provided adjacent to the gate dielectric layer 16, and a source electrode 20 and a drain electrode 22 for each transistor provided adjacent to the semiconductor layer 18.

For fabrication of thin-film transistors, the substrate 12 can be, for example: a silicon wafer; a glass plate; a steel foil; or a plastic sheet. The gate electrodes 14, for example, can be any conductive material such as metal or conductive polymer. The materials for use as the semiconductor layer 18, for example, can be inorganic materials such as amorphous silicon or polysilicon. Alternatively, the semiconductor layer 18 can be formed of organic semiconductors such as: polythiophene and its derivatives; oligothiophenes; and pentacene. In general, any semiconductive material useful in creating conventional thin film transistors can be used in this embodiment. The material for the gate dielectric layer 16 can be an organic or an inorganic material. Examples of suitable materials include, but are not limited to, polyimides, silicon dioxide, and a variety of inorganic coatings and glasses. The source and drain electrodes 20, 22 can be made of any conductive material such as metal or conductive polymer.

The array of transistors shown FIG. 1 can be manufactured using any one of many appropriate methods. For example, vacuum based methods such as evaporation or sputtering can be used to deposit the materials necessary to form the transistor and thereafter the deposited material can be patterned. Alternatively, wet printing methods or transfer methods can be used to deposit the materials necessary to form the transistors.

In the embodiment of FIG. 1, while the electrodes 14, 20, 22 (i.e., gate electrode, source electrode and drain electrode) are patterned, the semiconductor layer 18 and the gate dielectric layer 16 are not, resulting in significant reduction in processing efforts and cost. This circuit design can exhibit some cross-talk between adjacent transistors. The degree of cross-talk, however, can be reduced to a level that is acceptable for some applications.

For some applications, a degree of cross-talk can be tolerated. For example, if only a few gray level states of a display are addressed, then small stray voltages will not significantly affect the overall appearance of the display. In addition, if the display is designed for moderate resolution or over large areas, then neighboring circuit elements will be far apart from each other, reducing the effect of cross-talk.

In general, cross-talk errors are noticeable in displays only if they cause unwanted optical changes in pixel areas surrounding any one particular pixel element. In particular, if a pixel has only two possible switching states, i.e. either dark or light, then small deviations in the electronic signal due to cross-talk will not substantially change the optical appearance of the pixel. When intermediate optical states, i.e. gray levels, are being addressed, however, the display pixel elements will be more sensitive to errors. Here, it is more likely that an incorrect gray level will be displayed by a pixel.

Depending on a particular display type and application, a smaller or larger error tolerance can be preferred. A monochrome display, for example, may be able to tolerate leakage currents in excess of 10%, whereas a 256-level display would typically require a much lower leakage level. In a preferred embodiment, the display incorporates pixels with a limited number of gray levels. In this case, a given pixel is less sensitive to cross-talk induced voltage errors because it is switched between a limited number of optical states.

For a particular display, the acceptable leakage will depend on the extent of error in the electrical signal seen by a pixel and how that affects the optical state of the pixel. This will depend on the display medium. For displays that depend on a DC signal to switch, including electrophoretic and rotating ball displays, and ferroelectric liquid crystal displays, the switching electronic signal depends on both the magnitude and duration of the voltage applied. The acceptable leakage corresponds a maximum tolerable error in the optical state of a display pixel.

The array of transistors described in reference to FIG. 1 can be used for addressing an electronic display. This embodiment is applicable to a variety of electronic displays, including: electrophoretic displays; liquid crystal displays;

emissive displays (including organic light emitting materials); and, rotating ball displays. For liquid crystal displays, error limits place a demand on the time-averaged square of the voltage across the pixel. For current-driven, emissive displays, the acceptable tolerance in voltage variation will depend upon how emission varies with current through the pixel. In general, display types that have switching elements with a threshold associated with switching, rather than a gradual change in optical state, will be more tolerant of errors.

Figure 2:
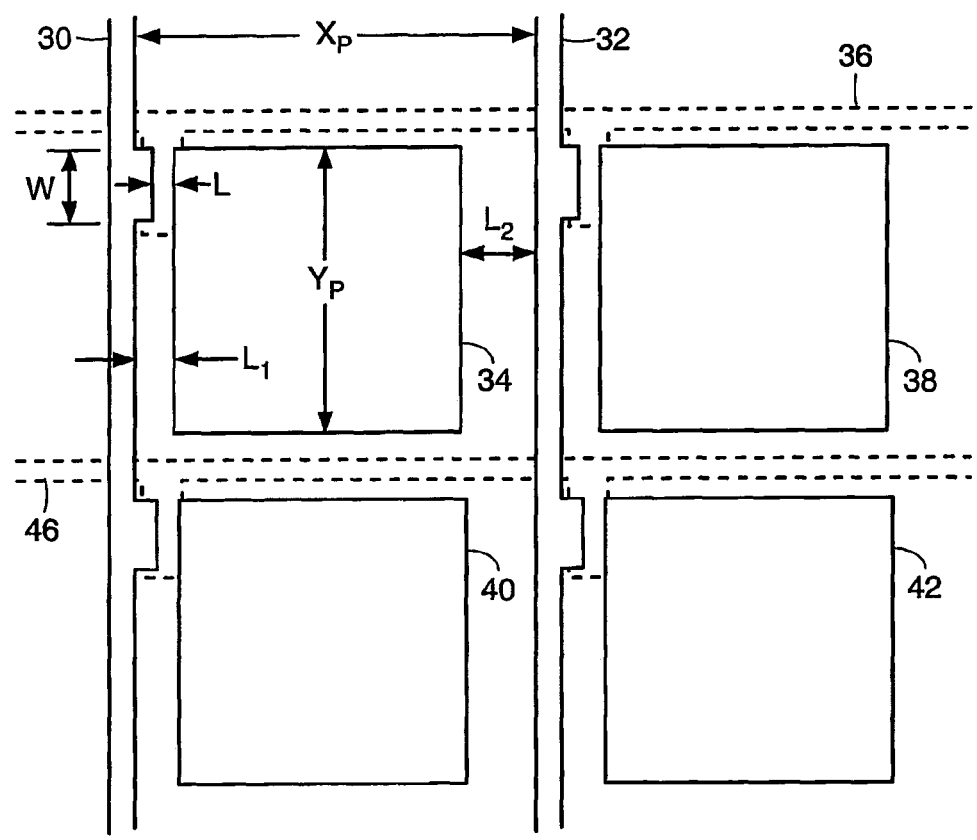
FIG. 2 shows a top view of one embodiment of an electronic display, with the display medium removed.

An array of transistors with acceptable cross-talk can be prepared by following the design rules provided herein in reference to FIG. 2, which illustrates a plan-view of the conductive leads and the elements for driving a display. An array comprises: data lines 30, 32; select lines 36, 46; and pixel electrodes 34, 38, 40, 42. To address a pixel electrode 34, 38, 40, 42, voltages are applied to appropriate data lines 30, 32 and select lines 36, 46. For example, to address particular pixel electrode 34, voltages are applied to data line 30 and select line 36. Changes in the optical characteristics of a display element are achieved by addressing a pixel electrode 34, 38, 40, 42 that is associated with the display element.

A preferred embodiment includes two design criteria for a properly functioning display. First, referring to FIG. 2, the resistive leakage between neighboring data lines 30, 32 must be small such that the voltage applied to each data lines 30, 32 can be controlled to within desired tolerances by the associated driver elements. A resistive leakage between neighboring data lines is too large when it leads to unacceptable resistive voltage drops in the driver circuit or in the data lines. Second, the current leakage from each of the two data lines 30 or 32 adjacent to the pixel electrode 34 with the pixel electrode 34 when the corresponding transistor is switched "off" must be sufficiently small to avoid unacceptable optical artifacts.

For displays where optical character is determined primarily by the time-varying voltage profile on the pixel electrode, such as electrophoretic and twisted-nematic displays, the current leakage must be sufficiently small over a period of time (the "frame time") required for a pixel to maintain a given optical state so that the pixel voltage does not change by an unacceptable amount during the period of time. A large current leakage between the data line 30 and pixel electrode 34 will cause an unintended shift in the pixel voltage, thus changing the optical state of that pixel. In a display using emissive material, such parasitic leakage currents can cause unwanted light emission from the pixel.

The following discussion illustrates how the above described two design criteria can be calculated. Since the semiconductor layer is much thinner than the lateral gaps between the electrical elements, resistance calculations can employ a thin-film approximation.

The first design criterion—The conduction between adjacent data lines 30, 32 is greatly facilitated by the presence of a column of pixel electrodes 34, 40. An efficient conduction path can be approximated as follows. Current can leak across the first data line 30 to the column of pixel electrodes 34, 40 next to the data line 30. Note that the display has a first row of pixel electrodes 34, 38 and a second row of pixel electrodes 40, 42. More generally, if there are N rows in a particular display, N being an integer, then there are N conduction paths in parallel between adjacent data lines 30, 32 and the resistive pathway between adjacent data lines 30, 32 can be approximated by the resistive elements shown in FIG. 3.

Figure 3:
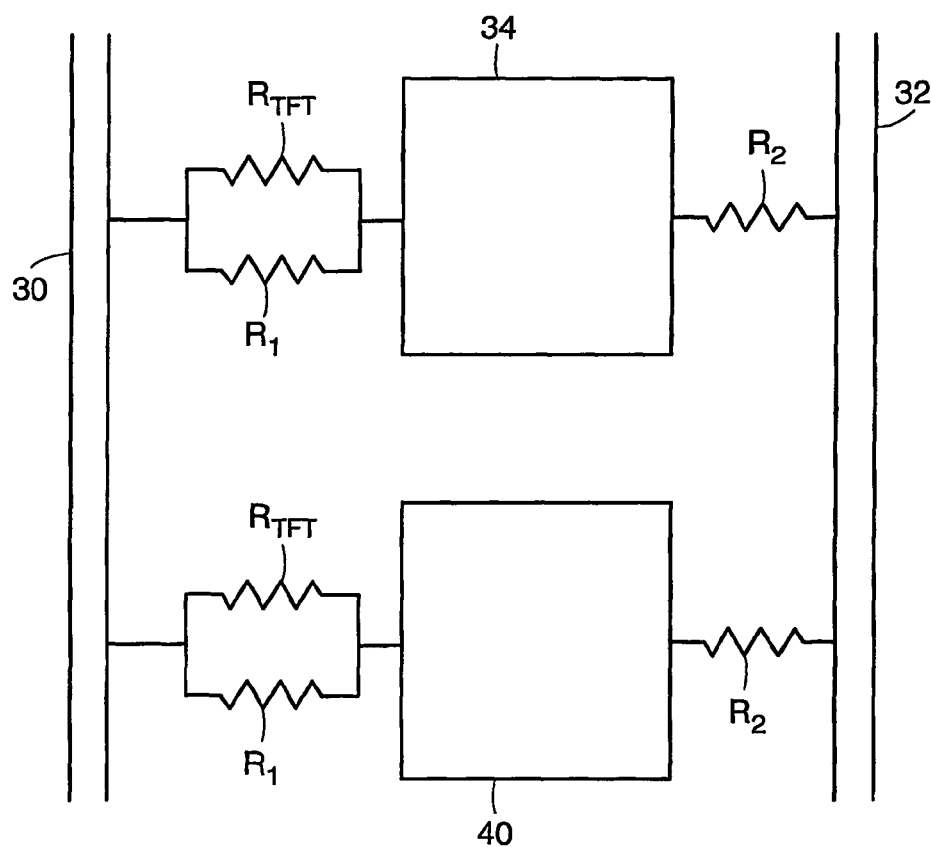
FIG. 3 illustrates locations of resistive leakage paths for the display of FIG. 2.

Referring to FIG. 3, $R_{TFT}$ is the resistance between the first data line 30 and the pixel electrode 34 through the thin-film transistor channel in the "off" state, R1 is the resistance across the remainder of the gap between the first data line 30 and the pixel electrode 34 and $R_2$ is the resistance across the gap between the pixel electrode 34 and the second data line 32. The resistive pathway provided directly between adjacent data lines 30, 32 along the region between neighboring pixel electrodes 34, 40 can be neglected as being insignificant in comparison to the pathway provided by the pixel electrodes 34, 40, i.e. the pixel electrodes 34, 40 are good conductors. Using this model, the resistance across adjacent data lines 30, 32 ($R_{dd}$) can be expressed as:

$$R_{dd} = \frac{1}{N}\left[R_2 + \left(\frac{1}{R_{TFT}} + \frac{1}{R_1}\right)^{-1}\right]$$

where $$R_{TFT} = \frac{\rho L}{Wh}$$

$$R_1 = \frac{\rho L_1}{(Y_p - W)h}$$

$$R_2 = \frac{\rho L_2}{Y_p h}$$

N is the number of rows of pixel electrodes, ρ is the bulk resistivity of the semiconducting layer, L is the distance between source and drain electrodes, L1 is the distance between a data line and the adjacent pixel electrode, $L_2$ is the distance between the pixel electrode and the neighboring data line, $Y_p$ is a width of a pixel electrode, W is the channel width, and h is the thickness of the continuous semiconductor layer.

A properly functioning display will have a resistance between adjacent data lines 30, 32 that is much greater than the resistance between the data lines 30, 32 and the voltage source ($R_d$).

In the approximation where the thin-film transistor channel width is much smaller than the pixel width ($Y_p$), this condition can be achieved by a display which obeys the two inequalities:

$$R_1 + R_2 >> NR_d$$

and $$R_{TFT} >> NR_d$$

The data line also should not charge up an adjacent pixel while the select line is off (row unselected). This demand can be translated as:

$$R_{TFT} >> R_p$$

and $$R_2 >> R_p$$

where $R_p$ is the resistance through the pixel.

For amorphous silicon, the resistivity (undoped) is approximately 108 ohm-cm. A typical semiconductor thickness is about 500 angstroms. This information and pixel dimensions can be used to calculate the relevant resistances.

The second design criterion The minimum spacing of a pixel electrode 34 to a data line 30, $L_{ms}$, can be derived from a consideration of the effect of the leakage on the pixel voltage. In order to avoid undesirable voltge shifts on the pixel, the following condition must be met:

$$I_{leak}T_f < C_p \delta V_p$$

where $I_{leak}$ is the leakage current from the data line to the pixel electrode through the unpatterned semiconductor layer, $T_f$ is the frame time, and $C_p$ is the total capacitance of the pixel. $\delta V_p$ is the maximum tolerance for leakage-induced voltage shifts on the pixel electrode. This value depends on how voltage shifts affect the optical state of the pixel and the tolerance defined by the display parameters.

$I_{leak}$, at the minimum spacing, can be expressed by:

$$I_{leak} = \sigma w h (V_p - V_d)/L_{ms}$$

where σ is the conductivity of the semiconductor material, w is the width of the leakage path, h is the thickness of the underlying semiconductor material, and $V_d$ is the voltage of the data line.

Combining the above two equations gives the following relation that defines a minimum spacing $L_{ms}$:

$$L_{ms} > \sigma w h (V_p - V_d) T_f / C_{pix} \delta V_p.$$

The above discussion applies to embodiments with a single leakage source. If there are multiple leakage sources, $I_{leak}$, will include leakage currents from each leakage source and the minimum spacing $L_{ms}$ for each leakage path must be derived accordingly.

Figure 4A:
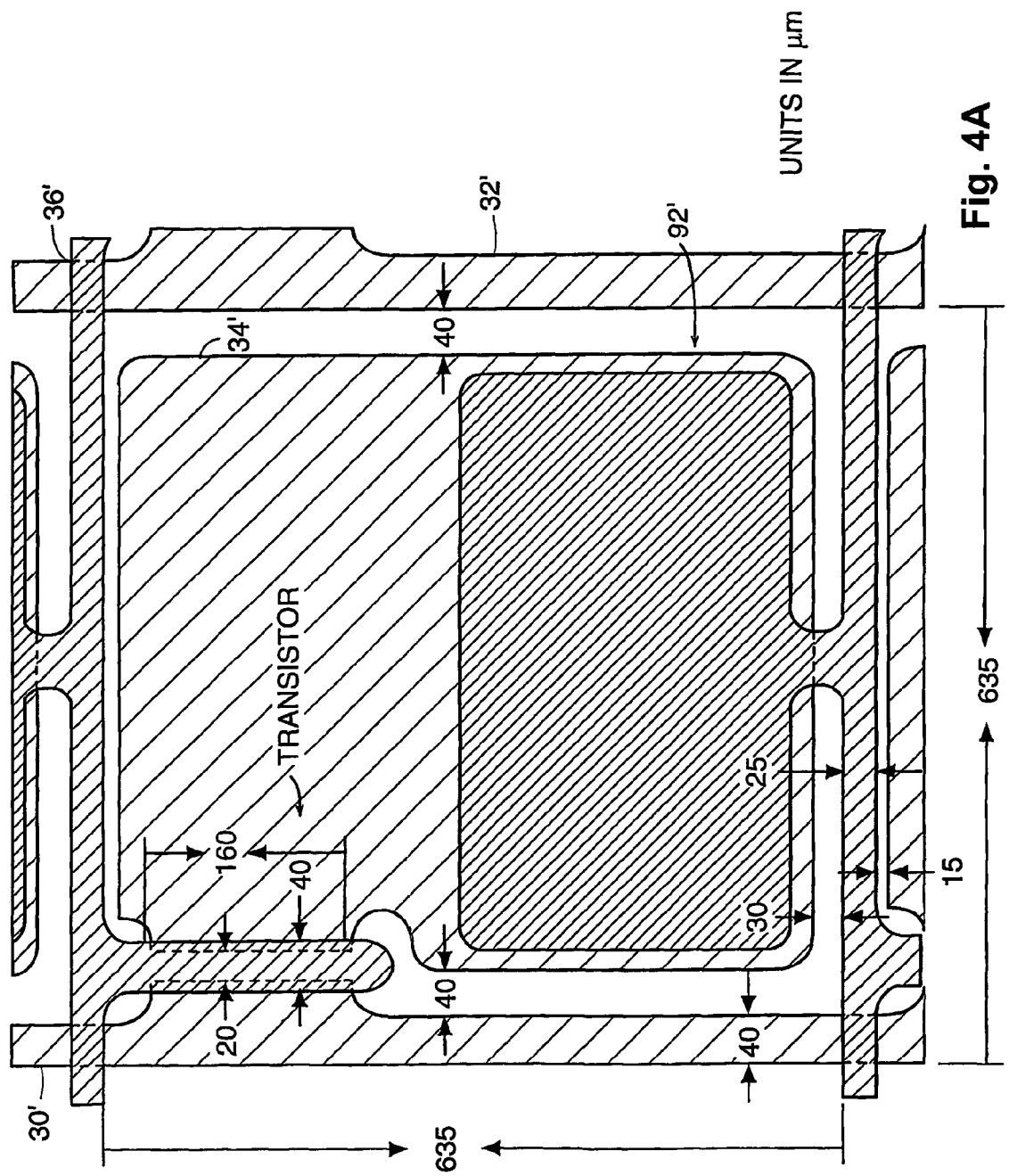
FIG. 4a shows a top view of an embodiment of a thin-film transistor.

A preferred embodiment of a thin-film transistor for use in an encapsulated electrophoretic display is shown in FIG. 4a. Referring to FIG. 4a, this preferred embodiment includes data lines 30', 32', a selection line 36', a pixel electrode 34', and a capacitor 92'. Various physical dimensions are indicated, in microns.

The embodiment of FIG. 4a is illustrated in cross section in FIG. 4b, though not to scale. Referring to FIG. 4b, the embodiment includes gate electodes 53', a SiN dielectric layer 54', an amorphous silicon layer 56', amorphous silicon contacts 58' drain and pixel electrodes 59', and capacitor 92'.

To illustrate the operating characteristics of the embodiment of FIG. 4, samples were prepared through either a two-mask process, as preferred, or a three-mask process, for comparison. In the two-mask process, the SiN dielectric layer 54' and the amorphous silicon layer 56' were not patterned while in the three mask process both the SiN dielectric layer 54' and the amorphous silicon layer 56' were patterned. The physical and experimentally measured electrical characteristics for these two samples are given in the table below.

Figure 5:
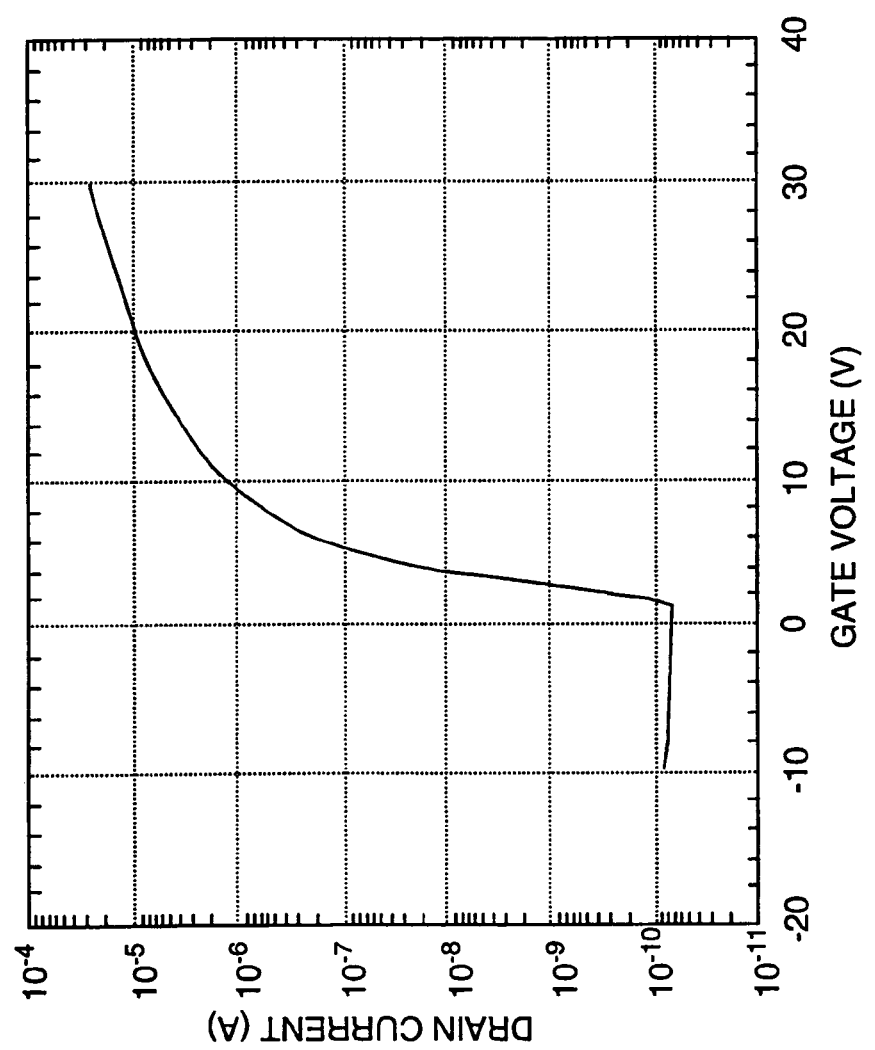

The leakage current and On/Off ratio for the unpatterned sample, as expected, are poorer than for the patterned sample. The unpatterned sample, however, is both suitable and preferable for many display applications, as discussed above. Referring to FIG. 5, the drain current versus gate voltage characteristics of the two-mask sample are shown. The drain current can be caused to vary by over five orders of magnitude by changing the gate voltage from zero to 30 volts. This large range makes this transistor suitable for many display applications.

Figure 6:
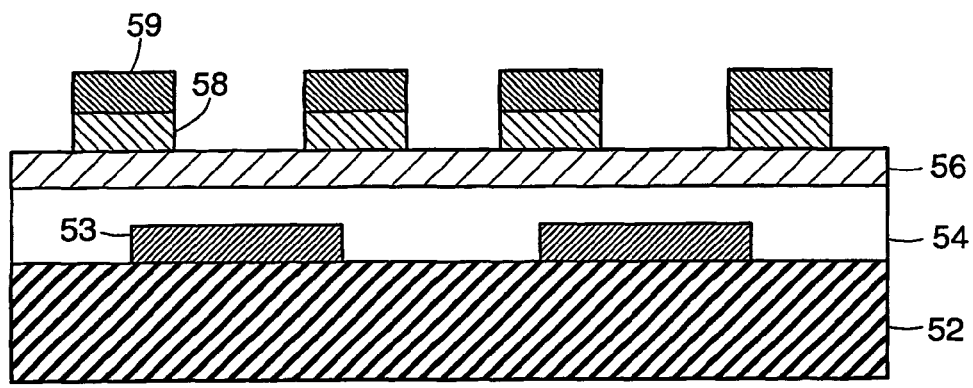
FIG. 6 shows a cross-sectional view of an array of thin-film transistors according to one embodiment of the present invention.

Further alternative embodiments of a thin-film transistor array are now given. Referring to FIG. 6, an array of bottom gate transistors 50 include a substrate 52, a patterned gate electrode 53 for each transistor provided adjacent the substrate 52, a dielectric layer 54 provided adjacent the gate electrodes 53 and the substrate 52, a boron-doped amorphous silicon layer 56 provided adjacent the dielectric layer 54, a plurality of patterned n+ doped amorphous silicon contacts 58 provided adjacent the amorphous silicon doped layer 56, and patterned source, drain or pixel electrodes 59 provided adjacent the patterned n+ doped amorphous silicon contacts 58. Each patterned n+ doped amorphous silicon contact 58 is provided between the amorphous silicon layer 56 and a patterned electrode 60 to provide better electrical contact. The contacts 58 at the metal-semiconductor interface ensure ohmic behavior. The contacts 58 can be deposited by the addition of $PH_3$ to $SiH_4$ in the gas phase. The contacts 58 can also be achieved by direct ion implantation of n-type dopants in selected areas of the intrinsic amorphous silicon layer 56 followed by high temperature annealing as an alternative to the additional n+amorphous silicon deposition step. The contacts 58, however, are not essential to produce a sufficiently functioning transistor.

Figure 7:
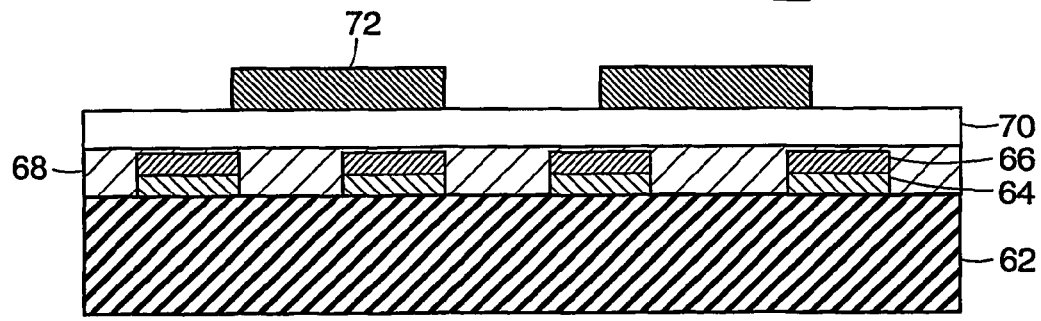
FIG. 7 shows a cross-sectional view of an array of thin-film transistors according to one embodiment of the present invention.

Referring to FIG. 7, an array of top gate transistors 60 include a substrate 62, patterned source, drain, and/or pixel electrodes 64 for each transistor provided adjacent the substrate 62, a patterned n+amorphous silicon contact 66 provided adjacent each electrode 64, a boron doped amorphous silicon layer 68 provided adjacent the contacts 66 and the substrate 62, a dielectric layer 70 provided adjacent to the boron doped amorphous silicon layer 68, and a gate electrode 72 for each transistor provided adjacent to the dielectric layer 70.

Figure 8:
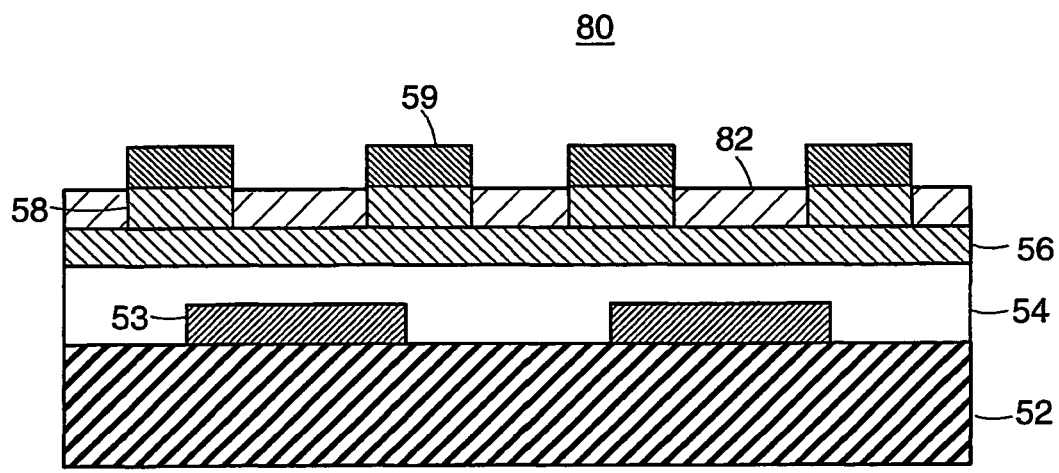
FIG. 8 shows a cross-sectional view of an array of thin-film transistors according to one embodiment of the present invention.

Referring to FIG. 8, an array of bottom gate transistors 80 is substantially similar to the transistors 50 of FIG. 6. The transistors 80 of FIG. 8 include a passivation layer 82 provided above the exposed regions of the boron doped amorphous silicon layer 56. The passivation layer 82 can be deposited after the patterning of the electrodes 59. For example, the passivation layer 82 can consist of silicon nitride. In one embodiment, a light blocking layer is incorporated into the array of transistors to shield any exposed silicon layer 56. The light blocking layer can be either light absorbing or reflective.

| Sample | WL | On/Off Ratio | Mobility | Threshold Voltage | $G_m$ | Max. Drain Current | Min. Drain Current | Storage capacitance |
|---|---|---|---|---|---|---|---|---|
| Patterned | 200/20 | $1 \times 10^8$ | .55 cm$^2$/Vs | 5.0 V | 18.9 nA/V$^2$ | 10 μA | 0.1 pA | 19.1 pF |
| Unpatterned | 160/20 | $3.3 \times 10^5$ | .43 cm$^2$/Vs | 5.0 V | 23.4 nA/V$^2$ | 20 μA | 60 pA | 18.4 pF |

Figure 9:
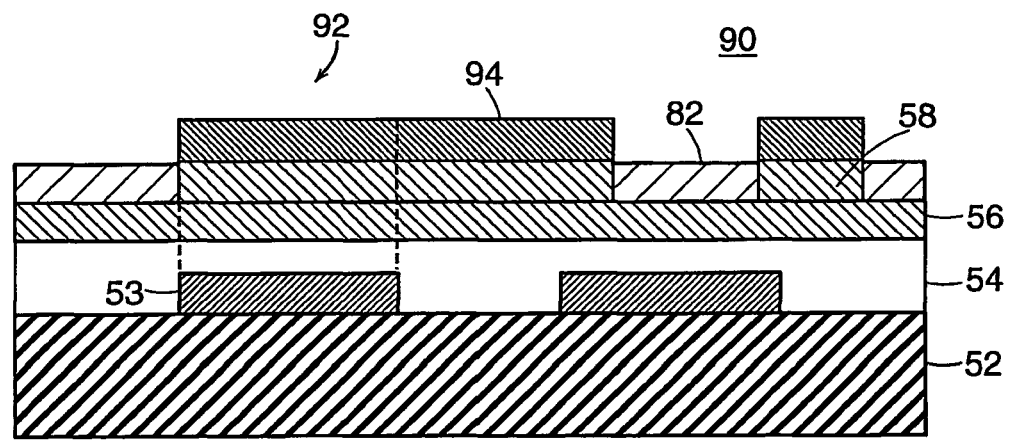
FIG. 9 shows a cross-sectional view of an array of thin-film transistors according to one embodiment of the present invention.

Referring to FIG. 9, an array of bottom gate transistors 90 is substantially similar to the array of transistors 80 of FIG. 8. The array of transistors 90 further incorporates a substrate capacitor 92. The substrate capacitor 92 can be formed simply by extending the pixel electrode 94 over the preceding gate line 53. The capacitance is directly proportional to the area of overlap.

In one alternative, inexpensive displays can be constructed by minimizing the number of patterning steps. Such a display can take different forms, including but not limited to: large area displays, displays with low-to-moderate pixel density, or microencapsulated electrophoretic display devices. In the preferred embodiment the semiconductor layer 18, 56, or 68 is unpatterned. Alternatively, the dielectric layer 16, 54, or 70 is unpatterned. Alternatively, both the semiconductor layer 18, 56, or 68 and the dielectric layer 16, 54, or 70 layer are unpatterned.

Figure 10:
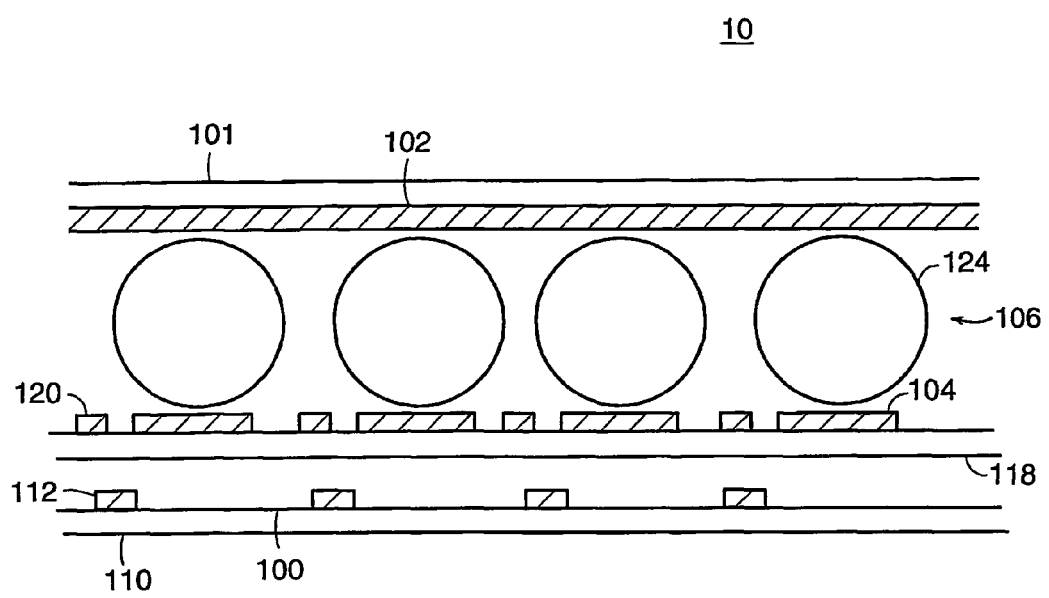
FIG. 10 shows a cross-sectional view of an electronic display according to one embodiment of the present invention.

An electronic display can incorporate an array of transistors as described above. Referring to FIG. 10, an electronic display 100 includes a substrate 101 supporting an electrode 102, a display medium 106 provided next to the electrode 102, a plurality of pixel electrodes 104 provided next to the display medium 106, and a plurality of discrete electronic devices (e.g., transistors) provided next to and in electrical communication with the pixel electrodes 104 supported by a substrate 110 provided next to and in electrical communication with the discrete electronic devices. The discrete electronic devices, in this embodiment, are transistors. The gate electrodes 112, the gate dielectric layer 100, the semiconductor layer 118 and the source electrodes 120 of the transistors are shown in this cross-section.

The substrate 101 can be made of a transparent material. The substrate 101 can also be a flexible substrate. For example, the substrate 101 can consist of polyester. The electrode 102 can be a common electrode. Alternatively, the electrode 102 can be a plurality of row electrodes. The electrode 102 can consist of a transparent conductive material. For example, an indium tin oxide (ITO), polyaniline or polythiophene coating can be provided on an inner surface of the substrate 101.

The display medium 106 can include a plurality of microcapsules 124 dispersed in a binder 126. Each microcapsule 124 can include an electro-optical material. An electro-optical material refers to a material which displays an optical property in response to an electrical signal. Electro-optical material, for example, can be electrophoretic particles or liquid crystals dispersed in a solvent. An electro-optical material can also be bichromal spheres dispersed in a solvent. Details of electro-optical materials within the microcapsules 124 will be discussed below. An important property of the electro-optical material within the microcapsules 124 is that the material is capable of displaying one visible state upon application of an electric field and a different visual state upon application of a different electric field.

In one embodiment, the display medium 106 comprises a particle-based display medium. In one detailed embodiment, the particle-based display medium comprises an electronic ink. An electronic ink is an optoelectronically active material which comprises at least two phases: an electrophoretic contrast medium phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include conducting or semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly(3,4-ethylenedioxythiophene) (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

The pixel electrodes 104 can be bonded to the display medium 106 through a binder. The binder, for example, can be a pressure sensitive adhesive. The pixel electrodes 104 can be made from any conductive material. The pixel electrodes 104 can be transparent or opaque. For example, the pixel electrodes 104 can be made from solder paste, copper, copper-clad polyimide, graphite inks, silver inks and other metal containing conductive inks. The pixel electrodes 104 can be formed on a substrate 110 and subsequently bonded to the display medium 106.

The discrete electronic devices can be non-linear devices such as transistor for addressing the pixels of the display. Alternatively, the non-linear devices can be diodes.

The electrodes 112, 120 can be made of any conductive material, either transparent or opaque. The conductive material can be printed, coated, or vacuum sputtered. For example, the electrodes 102, 112, 120 can also be made using transparent materials such as indium tin oxide and conductive polymers such as polyaniline or polythiophenes. Alternatively, the electrodes 102, 112, 120 can be made of opaque materials such as solder paste, copper, copper-clad polyimide, graphite inks, silver inks and other metal-containing conductive inks.

The architecture of the electronic display 100 shown in FIG. 10 is exemplary only and other architectures for an electronic display may also be used in accordance with this invention.

Materials for Use in Electrophoretic Displays

Useful materials for constructing the above-described encapsulated electrophoretic displays are discussed in detail below. Many of these materials will be known to those skilled in the art of constructing conventional electrophoretic displays, or those skilled in the art of microencapsulation. The combination of these materials and processes, along with the other necessary components found in an encapsulated electrophoretic display, comprise the invention described herein.

A. Particles

There is much flexibility in the choice of particles for use in electrophoretic displays, as described above. For purposes of this invention, a particle is any component that is charged or capable of acquiring a charge (i.e., has or is capable of acquiring electrophoretic mobility), and, in some cases, this mobility may be zero or close to zero (i.e., the particles will not move). The particles may be neat pigments, dyed (laked) pigments or pigment/polymer composites, or any other component that is charged or capable of acquiring a charge. Typical considerations for the electrophoretic particle are its optical properties, electrical properties, and surface chemistry. The particles may be organic or inorganic compounds, and they may either absorb light or scatter light. The particles for use in the invention may further include scattering pigments, absorbing pigments and luminescent particles. The particles may be retroreflective, such as corner cubes, or they may be electroluminescent, such as zinc sulfide particles, which emit light when excited by an AC field, or they may be photoluminescent. Finally, the particles may be surface treated so as to improve charging or interaction with a charging agent, or to improve dispersibility.

A preferred particle for use in electrophoretic displays of the invention is Titania. The titania particles may be coated with a metal oxide, such as aluminum oxide or silicon oxide, for example. The titania particles may have one, two, or more layers of metal-oxide coating. For example, a titania particle for use in electrophoretic displays of the invention may have a coating of aluminum oxide and a coating of silicon oxide. The coatings may be added to the particle in any order.

The electrophoretic particle is usually a pigment, a polymer, a laked pigment, or some combination of the above. A neat pigment can be any pigment, and, usually for a light colored particle, pigments such as, for example, rutile (titania), anatase (titania), barium sulfate, kaolin, or zinc oxide are useful. Some typical particles have high refractive indices, high scattering coefficients, and low absorption coefficients. Other particles are absorptive, such as carbon black or colored pigments used in paints and inks. The pigment should also be insoluble in the suspending fluid. Yellow pigments such as diarylide yellow, hansa yellow, and benzidin yellow have also found use in similar displays. Any other reflective material can be employed for a light colored particle, including non-pigment materials, such as metallic particles.

Useful neat pigments include, but are not limited to, $PbCrO_4$, Cyan blue GT 55-3295 (American Cyanamid Company, Wayne, N.J.), Cibacron Black BG (Ciba Company, Inc., Newport, Del.), Cibacron Turquoise Blue G (Ciba), Cibalon Black BGL (Ciba), Orasol Black BRG (Ciba), Orasol Black RBL (Ciba), Acetamine Blac, CBS (E.I. du Pont de Nemours and Company, Inc., Wilmington, Del.), Crocein Scarlet N Ex (du Pont) (27290), Fiber Black VF (DuPont) (30235), Luxol Fast Black L (DuPont) (Solv. Black 17), Nirosine Base No. 424 (DuPont) (50415B), Oil Black BG (DuPont) (Solv. Black 16), Rotalin Black RM (DuPont), Sevron Brilliant Red 3B (DuPont); Basic Black DSC (Dye Specialties, Inc.), Hectolene Black (Dye Specialties, Inc.), Azosol Brilliant Blue B (GAF, Dyestuff and Chemical Division, Wayne, N.J.) (Solv. Blue 9), Azosol Brilliant Green BA (GAF) (Solv. Green 2), Azosol Fast Brilliant Red B (GAF), Azosol Fast Orange RA Conc. (GAF) (Solv. Orange 20), Azosol Fast Yellow GRA Conc. (GAF) (13900 A), Basic Black KMPA (GAF), Benzofix Black CW-CF (GAF) (35435), Cellitazol BNFV Ex Soluble CF (GAF) (Disp. Black 9), Celliton Fast Blue AF Ex Conc (GAF) (Disp. Blue 9), Cyper Black Iowa (GAF) (Basic Blk. 3), Diamine Black CAP Ex Conc (GAF) (30235), Diamond Black EAN Hi Con. CF (GAF) (15710), Diamond Black PBBA Ex (GAF) (16505); Direct Deep Black EA Ex CF (GAF) (30235), Hansa Yellow G (GAF) (11680); Indanthrene Black BBK Powd. (GAF) (59850), Indocarbon CLGS Conc. CF (GAF) (53295), Katigen Deep Black NND Hi Conc. CF (GAF) (15711), Rapidogen Black 3G (GAF) (Azoic Blk. 4); Sulphone Cyanine Black BA-CF (GAF) (26370), Zambezi Black VD Ex Conc. (GAF) (30015); Rubanox Red CP-1495 (The Sherwin-Williams Company, Cleveland, Ohio) (15630); Raven 11 (Columbian Carbon Company, Atlanta, Ga.), (carbon black aggregates with a particle size of about 25 µm), Statex B-12 (Columbian Carbon Co.) (a furnace black of 33 µm average particle size), and chrome green.

Particles may also include laked, or dyed, pigments. Laked pigments are particles that have a dye precipitated on them or which are stained. Lakes are metal salts of readily soluble anionic dyes. These are dyes of azo, triphenylmethane or anthraquinone structure containing one or more sulphonic or carboxylic acid groupings. They are usually precipitated by a calcium, barium or aluminum salt onto a substrate. Typical examples are peacock blue lake (CI Pigment Blue 24) and Persian orange (lake of CI Acid Orange 7), Black M Toner (GAF) (a mixture of carbon black and black dye precipitated on a lake).

A dark particle of the dyed type may be constructed from any light absorbing material, such as carbon black, or inorganic black materials. The dark material may also be selectively absorbing. For example, a dark green pigment may be used. Black particles may also be formed by staining latices with metal oxides, such latex copolymers consisting of any of butadiene, styrene, isoprene, methacrylic acid, methyl methacrylate, acrylonitrile, vinyl chloride, acrylic acid, sodium styrene sulfonate, vinyl acetate, chlorostyrene, dimethylaminopropylmethacrylamide, isocyanoethyl methacrylate and N-(isobutoxymethacrylamide), and optionally including conjugated diene compounds such as diacrylate, triacrylate, dimethylacrylate and trimethacrylate. Black particles may also be formed by a dispersion polymerization technique.

In the systems containing pigments and polymers, the pigments and polymers may form multiple domains within the electrophoretic particle, or be aggregates of smaller pigment/polymer combined particles. Alternatively, a central pigment core may be surrounded by a polymer shell. The pigment, polymer, or both can contain a dye. The optical purpose of the particle may be to scatter light, absorb light, or both. Useful sizes may range from 1 nm up to about 100 μm, as long as the particles are smaller than the bounding capsule. In a preferred embodiment, the density of the electrophoretic particle may be substantially matched to that of the suspending (i.e., electrophoretic) fluid. As defined herein, a suspending fluid has a density that is "substantially matched" to the density of the particle if the difference in their respective densities is between about zero and about two g/ml. This difference is preferably between about zero and about 0.5 g/ml.

Useful polymers for the particles include, but are not limited to: polystyrene, polyethylene, polypropylene, phenolic resins, Du Pont Elvax resins (ethylene-vinyl acetate copolymers), polyesters, polyacrylates, polymethacrylates, ethylene acrylic acid or methacrylic acid copolymers (Nucrel Resins—DuPont, Primacor Resins-Dow Chemical), acrylic copolymers and terpolymers (Elvacite Resins, DuPont) and PMMA. Useful materials for homopolymer/pigment phase separation in high shear melt include, but are not limited to, polyethylene, polypropylene, polymethylmethacrylate, polyisobutylmethacrylate, polystyrene, polybutadiene, polyisoprene, polyisobutylene, polylauryl methacrylate, polystearyl methacrylate, polyisobornyl methacrylate, poly-t-butyl methacrylate, polyethyl methacrylate, polymethyl acrylate, polyethyl acrylate, polyacrylonitrile, and copolymers of two or more of these materials. Some useful pigment/polymer complexes that are commercially available include, but are not limited to, Process Magenta PM 1776 (Magruder Color Company, Inc., Elizabeth, N.J.), Methyl Violet PMA VM6223 (Magruder Color Company, Inc., Elizabeth, N.J.), and Naphthol FGR RF6257 (Magruder Color Company, Inc., Elizabeth, N.J.).

The pigment-polymer composite may be formed by a physical process, (e.g., attrition or ball milling), a chemical process (e.g., microencapsulation or dispersion polymerization), or any other process known in the art of particle production. From the following non-limiting examples, it may be seen that the processes and materials for both the fabrication of particles and the charging thereof are generally derived from the art of liquid toner, or liquid immersion development. Thus any of the known processes from liquid development are particularly, but not exclusively, relevant.

New and useful electrophoretic particles may still be discovered, but a number of particles already known to those skilled in the art of electrophoretic displays and liquid toners can also prove useful. In general, the polymer requirements for liquid toners and encapsulated electrophoretic inks are similar, in that the pigment or dye must be easily incorporated therein, either by a physical, chemical, or physico-chemical process, may aid in the colloidal stability, and may contain charging sites or may be able to incorporate materials which contain charging sites. One general requirement from the liquid toner industry that is not shared by encapsulated electrophoretic inks is that the toner must be capable of "fixing" the image, i.e., heat fusing together to create a uniform film after the deposition of the toner particles.

Typical manufacturing techniques for particles are drawn from the liquid toner and other arts and include ball milling, attrition, jet milling, etc. The process will be illustrated for the case of a pigmented polymeric particle. In such a case the pigment is compounded in the polymer, usually in some kind of high shear mechanism such as a screw extruder. The composite material is then (wet or dry) ground to a starting size of around 10 μm. It is then dispersed in a carrier liquid, for example ISOPAR® (Exxon, Houston, Tex.), optionally with some charge control agent(s), and milled under high shear for several hours down to a final particle size and/or size distribution.

Another manufacturing technique for particles drawn from the liquid toner field is to add the polymer, pigment, and suspending fluid to a media mill. The mill is started and simultaneously heated to temperature at which the polymer swells substantially with the solvent. This temperature is typically near 100° C. In this state, the pigment is easily encapsulated into the swollen polymer. After a suitable time, typically a few hours, the mill is gradually cooled back to ambient temperature while stirring. The milling may be continued for some time to achieve a small enough particle size, typically a few microns in diameter. The charging agents may be added at this time. Optionally, more suspending fluid may be added.

Chemical processes such as dispersion polymerization, mini- or micro-emulsion polymerization, suspension polymerization precipitation, phase separation, solvent evaporation, in situ polymerization, seeded emulsion polymerization, or any process which falls under the general category of microencapsulation may be used. A typical process of this type is a phase separation process wherein a dissolved polymeric material is precipitated out of solution onto a dispersed pigment surface through solvent dilution, evaporation, or a thermal change. Other processes include chemical means for staining polymeric latices, for example with metal oxides or dyes.

B. Suspending Fluid

The suspending fluid containing the particles can be chosen based on properties such as density, refractive index, and solubility. A preferred suspending fluid has a low dielectric constant (about 2), high volume resistivity (about $10^{15}$ ohm-cm), low viscosity (less than 5 cst), low toxicity and environmental impact, low water solubility (less than 10 ppm), high specific gravity (greater than 1.5), a high boiling point (greater than 90° C.), and a low refractive index (less than 1.2).

The choice of suspending fluid may be based on concerns of chemical inertness, density matching to the electrophoretic particle, or chemical compatibility with both the electrophoretic particle and bounding capsule. The viscosity of the fluid should be low when you want the particles to move. The refractive index of the suspending fluid may also be substantially matched to that of the particles. As used herein, the refractive index of a suspending fluid "is substantially matched" to that of a particle if the difference between their respective refractive indices is between about zero and about 0.3, and is preferably between about 0.05 and about 0.2.

Additionally, the fluid may be chosen to be a poor solvent for some polymers, which is advantageous for use in the fabrication of microparticles because it increases the range of polymeric materials useful in fabricating particles of polymers and pigments. Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid.

Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytox® from DuPont (Wilmington, Del.). In a preferred embodiment, the suspending fluid is a poly(chlorotrifluoroethylene) polymer. In a particularly preferred embodiment, this polymer has a degree of polymerization from about 2 to about 10. Many of the above materials are available in a range of viscosities, densities, and boiling points.

The fluid must be capable of being formed into small droplets prior to a capsule being formed. Processes for forming small droplets include flow-through jets, membranes, nozzles, or orifices, as well as shear-based emulsifying schemes. The formation of small drops may be assisted by electrical or sonic fields. Surfactants and polymers can be used to aid in the stabilization and emulsification of the droplets in the case of an emulsion type encapsulation. A preferred surfactant for use in displays of the invention is sodium dodecylsulfate.

It can be advantageous in some displays for the suspending fluid to contain an optically absorbing dye. This dye must be soluble in the fluid, but will generally be insoluble in the other components of the capsule. There is much flexibility in the choice of dye material. The dye can be a pure compound, or blends of dyes to achieve a particular color, including black. The dyes can be fluorescent, which would produce a display in which the fluorescence properties depend on the position of the particles. The dyes can be photoactive, changing to another color or becoming colorless upon irradiation with either visible or ultraviolet light, providing another means for obtaining an optical response. Dyes could also be polymerizable, forming a solid absorbing polymer inside the bounding shell.

There are many dyes that can be chosen for use in encapsulated electrophoretic display. Properties important here include light fastness, solubility in the suspending liquid, color, and cost. These are generally from the class of azo, anthraquinone, and triphenylmethane type dyes and may be chemically modified so as to increase the solubility in the oil phase and reduce the adsorption by the particle surface.

A number of dyes already known to those skilled in the art of electrophoretic displays will prove useful. Useful azo dyes include, but are not limited to: the Oil Red dyes, and the Sudan Red and Sudan Black series of dyes. Useful anthraquinone dyes include, but are not limited to: the Oil Blue dyes, and the Macrolex Blue series of dyes. Useful triphenylmethane dyes include, but are not limited to, Michler's hydrol, Malachite Green, Crystal Violet, and Auramine 0.

C. Charge Control Agents and Particle Stabilizers

Charge control agents are used to provide good electrophoretic mobility to the electrophoretic particles. Stabilizers are used to prevent agglomeration of the electrophoretic particles, as well as prevent the electrophoretic particles from irreversibly depositing onto the capsule wall. Either component can be constructed from materials across a wide range of molecular weights (low molecular weight, oligomeric, or polymeric), and may be pure or a mixture. In particular, suitable charge control agents are generally adapted from the liquid toner art. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

An optional charge control agent or charge director may be used. These constituents typically consist of low molecular weight surfactants, polymeric agents, or blends of one or more components and serve to stabilize or otherwise modify the sign and/or magnitude of the charge on the electrophoretic particles. The charging properties of the pigment itself may be accounted for by taking into account the acidic or basic surface properties of the pigment, or the charging sites may take place on the carrier resin surface (if present), or a combination of the two. Additional pigment properties which may be relevant are the particle size distribution, the chemical composition, and the lightfastness. The charge control agent used to modify and/or stabilize the particle surface charge is applied as generally known in the arts of liquid toners, electrophoretic displays, non-aqueous paint dispersions, and engine-oil additives. In all of these arts, charging species may be added to non-aqueous media in order to increase electrophoretic mobility or increase electrostatic stabilization. The materials can improve steric stabilization as well. Different theories of charging are postulated, including selective ion adsorption, proton transfer, and contact electrification.

Charge adjuvants may also be added. These materials increase the effectiveness of the charge control agents or charge directors. The charge adjuvant may be a polyhydroxy compound or an aminoalcohol compound, which are preferably soluble in the suspending fluid in an amount of at least 2% by weight. Examples of polyhydroxy compounds which contain at least two hydroxyl groups include, but are not limited to, ethylene glycol, 2,4,7,9-tetramethyl-decyne-4,7-diol, poly(propylene glycol), pentaethylene glycol, tripropylene glycol, triethylene glycol, glycerol, pentaerythritol, glycerol tris(12 hydroxystearate), propylene glycol monohydroxystearate, and ethylene glycol monohydroxystrearate. Examples of aminoalcohol compounds which contain at least one alcohol function and one amine function in the same molecule include, but are not limited to, triisopropanolamine, triethanolamine, ethanolamine, 3-amino-1-propanol, o-aminophenol, 5-amino-1-pentanol, and tetrakis (2-hydroxyethyl)ethylene-diamine. The charge adjuvant is preferably present in the suspending fluid in an amount of about 1 to about 100 mg/g of the particle mass, and more preferably about 50 to about 200 mg/g.

The surface of the particle may also be chemically modified to aid dispersion, to improve surface charge, and to improve the stability of the dispersion, for example. Surface modifiers include organic siloxanes, organohalogen silanes and other functional silane coupling agents (Dow Corning® Z-6070, Z-6124, and 3 additive, Midland, Mich.); organic titanates and zirconates (Tyzor® TOT, TBT, and TE Series, DuPont, Wilmington, Del.); hydrophobing agents, such as long chain (C12 to C50) alkyl and alkyl benzene sulphonic acids, fatty amines or diamines and their salts or quarternary derivatives; and amphipathic polymers which can be covalently bonded to the particle surface.

In general, it is believed that charging results as an acid-base reaction between some moiety present in the continuous phase and the particle surface. Thus useful materials are those which are capable of participating in such a reaction, or any other charging reaction as known in the art.

Different non-limiting classes of charge control agents which are useful include organic sulfates or sulfonates, metal soaps, block or comb copolymers, organic amides, organic zwitterions, and organic phosphates and phosphonates. Useful organic sulfates and sulfonates include, but are not limited to, sodium bis(2-ethyl hexyl) sulfosuccinate, calcium dodecyl benzene sulfonate, calcium petroleum sulfonate, neutral or basic barium dinonylnaphthalene sulfonate, neutral or basic calcium dinonylnaphthalene sulfonate, dodecylbenzenesulfonic acid sodium salt, and ammonium lauryl sulphate. Useful metal soaps include, but are not limited to, basic or neutral barium petronate, calcium petronate, Co-, Ca-, Cu-, Mn-, Ni-, Zn-, and Fe- salts of naphthenic acid, Ba-, Al-, Zn-, Cu-, Pb-, and Fe- salts of stearic acid, divalent and trivalent metal carboxylates, such as aluminum tristearate, aluminum octoanate, lithium heptanoate, iron stearate, iron distearate, barium stearate, chromium stearate, magnesium octanoate, calcium stearate, iron naphthenate, and zinc naphthenate, Mn- and Zn- heptanoate, and Ba-, Al-, Co-, Mn-, and Zn- octanoate. Useful block or comb copolymers include, but are not limited to, AB diblock copolymers of (A) polymers of 2-(N,N)-dimethylaminoethyl methacrylate quaternized with methyl-p-toluenesulfonate and (B) poly-2-ethylhexyl methacrylate, and comb graft copolymers with oil soluble tails of poly (12-hydroxystearic acid) and having a molecular weight of about 1800, pendant on an oil-soluble anchor group of poly (methyl methacrylate-methacrylic acid). Useful organic amides include, but are not limited to, polyisobutylene succinimides such as OLOA 1200, and N-vinyl pyrrolidone polymers. Useful organic zwitterions include, but are not limited to, lecithin. Useful organic phosphates and phosphonates include, but are not limited to, the sodium salts of phosphated mono- and di-glycerides with saturated and unsaturated acid substituents.

Particle dispersion stabilizers may be added to prevent particle flocculation or attachment to the capsule walls. For the typical high resistivity liquids used as suspending fluids in electrophoretic displays, nonaqueous surfactants may be used. These include, but are not limited to, glycol ethers, acetylenic glycols, alkanolamides, sorbitol derivatives, alkyl amines, quaternary amines, imidazolines, dialkyl oxides, and sulfosuccinates.

D. Encapsulation

There is a long and rich history to encapsulation, with numerous processes and polymers having proven useful in creating capsules. Encapsulation of the internal phase may be accomplished in a number of different ways. Numerous suitable procedures for microencapsulation are detailed in both *Microencapsulation, Processes and Applications*, (I. E. Vandegaer, ed.), Plenum Press, New York, N.Y. (1974) and Gutcho, *Microcapsules and Mircroencapsulation Techniques*, Nuyes Data Corp., Park Ridge, N.J. (1976). The processes fall into several general categories, all of which can be applied to the present invention: interfacial polymerization, in situ polymerization, physical processes, such as coextrusion and other phase separation processes, in-liquid curing, and simple/complex coacervation.

Numerous materials and processes should prove useful in formulating displays of the present invention. Useful materials for simple coacervation processes include, but are not limited to, gelatin, polyvinyl alcohol, polyvinyl acetate, and cellulosic derivatives, such as, for example, carboxymethylcellulose. Useful materials for complex coacervation processes include, but are not limited to, gelatin, acacia, carageenan, carboxymethylcellulose, hydrolized styrene anhydride copolymers, agar, alginate, casein, albumin, methyl vinyl ether co-maleic anhydride, and cellulose phthalate. Useful materials for phase separation processes include, but are not limited to, polystyrene, PMMA, polyethyl methacrylate, polybutyl methacrylate, ethyl cellulose, polyvinyl pyridine, and poly acrylonitrile. Useful materials for in situ polymerization processes include, but are not limited to, polyhydroxyamides, with aldehydes, melamine, or urea and formaldehyde; water-soluble oligomers of the condensate of melamine, or urea and formaldehyde; and vinyl monomers, such as, for example, styrene, MMA and acrylonitrile. Finally, useful materials for interfacial polymerization processes include, but are not limited to, diacyl chlorides, such as, for example, sebacoyl, adipoyl, and di- or poly-amines or alcohols, and isocyanates. Useful emulsion polymerization materials may include, but are not limited to, styrene, vinyl acetate, acrylic acid, butyl acrylate, t-butyl acrylate, methyl methacrylate, and butyl methacrylate.

Capsules produced may be dispersed into a curable carrier, resulting in an ink which may be printed or coated on large and arbitrarily shaped or curved surfaces using conventional printing and coating techniques.

In the context of the present invention, one skilled in the art will select an encapsulation procedure and wall material based on the desired capsule properties. These properties include the distribution of capsule radii; electrical, mechanical, diffusion, and optical properties of the capsule wall; and chemical compatibility with the internal phase of the capsule.

The capsule wall generally has a high electrical resistivity. Although it is possible to use walls with relatively low resistivities, this may limit performance in requiring relatively higher addressing voltages. The capsule wall should also be mechanically strong (although if the finished capsule powder is to be dispersed in a curable polymeric binder for coating, mechanical strength is not as critical). The capsule wall should generally not be porous. If, however, it is desired to use an encapsulation procedure that produces porous capsules, these can be overcoated in a post-processing step (i.e., a second encapsulation). Moreover, if the capsules are to be dispersed in a curable binder, the binder will serve to close the pores. The capsule walls should be optically clear. The wall material may, however, be chosen to match the refractive index of the internal phase of the capsule (i.e., the suspending fluid) or a binder in which the capsules are to be dispersed. For some applications (e.g., interposition between two fixed electrodes), monodispersed capsule radii are desirable.

An encapsulation procedure involves a polymerization between urea and formaldehyde in an aqueous phase of an oil/water emulsion in the presence of a negatively charged, carboxyl-substituted, linear hydrocarbon polyelectrolyte material. The resulting capsule wall is a urea/formaldehyde copolymer, which discretely encloses the internal phase. The capsule is clear, mechanically strong, and has good resistivity properties.

The related technique of in situ polymerization utilizes an oil/water emulsion, which is formed by dispersing the electrophoretic composition (i.e., the dielectric liquid containing a suspension of the pigment particles) in an aqueous environment. The monomers polymerize to form a polymer with higher affinity for the internal phase than for the aqueous phase, thus condensing around the emulsified oily droplets. In one especially useful in situ polymerization processes, urea and formaldehyde condense in the presence of poly (acrylic acid) (See, e.g., U.S. Pat. No. 4,001,140). In other useful process, any of a variety of cross-linking agents borne in aqueous solution is deposited around microscopic oil droplets. Such cross-linking agents include aldehydes, especially formaldehyde, glyoxal, or glutaraldehyde; alum; zirconium salts; and poly isocyanates. The entire disclosures of the U.S. Pat. Nos. 4,001,140 and 4,273,672 patents are hereby incorporated by reference herein.

The coacervation approach also utilizes an oil/water emulsion. One or more colloids are coacervated (i.e., agglomerated) out of the aqueous phase and deposited as shells around the oily droplets through control of temperature, pH and/or relative concentrations, thereby creating the microcapsule. Materials suitable for coacervation include gelatins and gum arabic.

The interfacial polymerization approach relies on the presence of an oil-soluble monomer in the electrophoretic composition, which once again is present as an emulsion in an aqueous phase. The monomers in the minute hydrophobic droplets react with a monomer introduced into the aqueous phase, polymerizing at the interface between the droplets and the surrounding aqueous medium and forming shells around the droplets. Although the resulting walls are relatively thin and may be permeable, this process does not require the elevated temperatures characteristic of some other processes, and therefore affords greater flexibility in terms of choosing the dielectric liquid.

Coating aids can be used to improve the uniformity and quality of the coated or printed electrophoretic ink material. Wetting agents are typically added to adjust the interfacial tension at the coating/substrate interface and to adjust the liquid/air surface tension. Wetting agents include, but are not limited to, anionic and cationic surfactants, and nonionic species, such as silicone or fluoropolymer based materials. Dispersing agents may be used to modify the interfacial tension between the capsules and binder, providing control over flocculation and particle settling.

Surface tension modifiers can be added to adjust the air/ink interfacial tension. Polysiloxanes are typically used in such an application to improve surface leveling while minimizing other defects within the coating. Surface tension modifiers include, but are not limited to, fluorinated surfactants, such as, for example, the Zonyl® series from DuPont (Wilmington, Del.), the Fluorod® series from 3M (St. Paul, Minn.), and the fluoroakyl series from Autochem (Glen Rock, N.J.); siloxanes, such as, for example, Silwet® from Union Carbide (Danbury, Conn.); and polyethoxy and polypropoxy alcohols. Antifoams, such as silicone and silicone-free polymeric materials, may be added to enhance the movement of air from within the ink to the surface and to facilitate the rupture of bubbles at the coating surface. Other useful antifoams include, but are not limited to, glyceryl esters, polyhydric alcohols, compounded antifoams, such as oil solutions of alkyl benzenes, natural fats, fatty acids, and metallic soaps, and silicone antifoaming agents made from the combination of dimethyl siloxane polymers and silica. Stabilizers such as uv-absorbers and antioxidants may also be added to improve the lifetime of the ink.

Other additives to control properties like coating viscosity and foaming can also be used in the coating fluid. Stabilizers (UV-absorbers, antioxidants) and other additives which could prove useful in practical materials.

E. Binder Material

The binder is used as a non-conducting, adhesive medium supporting and protecting the capsules, as well as binding the electrode materials to the capsule dispersion. Binders are available in many forms and chemical types. Among these are water-soluble polymers, water-borne polymers, oil-soluble polymers, thermoset and thermoplastic polymers, and radiation-cured polymers.

Among the water-soluble polymers are the various polysaccharides, the polyvinyl alcohols, N-methylpyrrolidone, N-vinylpyrrollidone, the various Carbowax® species (Union Carbide, Danbury, Conn.), and poly-2-hydroxyethylacrylate.

The water-dispersed or water-borne systems are generally latex compositions, typified by the Neorez® and Neocryl® resins (Zeneca Resins, Wilmington, Mass.), Acrysol® (Rohm and Haas, Philadelphia, Pa.), Bayhydrol® (Bayer, Pittsburgh, Pa.), and the Cytec Industries (West Paterson, N.J.) HP line. These are generally latices of polyurethanes, occasionally compounded with one or more of the acrylics, polyesters, polycarbonates or silicones, each lending the final cured resin in a specific set of properties defined by glass transition temperature, degree of "tack," softness, clarity, flexibility, water permeability and solvent resistance, elongation modulus and tensile strength, thermoplastic flow, and solids level. Some water-borne systems can be mixed with reactive monomers and catalyzed to form more complex resins. Some can be further cross-linked by the use of a crosslinking reagent, such as an aziridine, for example, which reacts with carboxyl groups.

A typical application of a water-borne resin and aqueous capsules follows. A volume of particles is centrifuged at low speed to separate excess water. After a given centrifugation process, for example 10 minutes at 60×G, the capsules are found at the bottom of the centrifuge tube, while the water portion is at the top. The water portion is carefully removed (by decanting or pipetting). The mass of the remaining capsules is measured, and a mass of resin is added such that the mass of resin is between one eighth and one tenth of the weight of the capsules. This mixture is gently mixed on an oscillating mixer for approximately one half hour. After about one half hour, the mixture is ready to be coated onto the appropriate substrate.

The thermoset systems are exemplified by the family of epoxies. These binary systems can vary greatly in viscosity, and the reactivity of the pair determines the "pot life" of the mixture. If the pot life is long enough to allow a coating operation, capsules may be coated in an ordered arrangement in a coating process prior to the resin curing and hardening.

Thermoplastic polymers, which are often polyesters, are molten at high temperatures. A typical application of this type of product is hot-melt glue. A dispersion of heat-resistant capsules could be coated in such a medium. The solidification process begins during cooling, and the final hardness, clarity and flexibility are affected by the branching and molecular weight of the polymer.

Oil or solvent-soluble polymers are often similar in composition to the water-borne system, with the obvious exception of the water itself. The latitude in formulation for solvent systems is enormous, limited only by solvent choices and polymer solubility. Of considerable concern in solvent-based systems is the viability of the capsule itself—the integrity of the capsule wall cannot be compromised in any way by the solvent.

Radiation cure resins are generally found among the solvent-based systems. Capsules may be dispersed in such a medium and coated, and the resin may then be cured by a timed exposure to a threshold level of ultraviolet radiation, either long or short wavelength. As in all cases of curing polymer resins, final properties are determined by the branching and molecular weights of the monomers, oligomers and crosslinkers.

A number of "water-reducible" monomers and oligomers are, however, marketed. In the strictest sense, they are not water soluble, but water is an acceptable diluent at low concentrations and can be dispersed relatively easily in the mixture. Under these circumstances, water is used to reduce the viscosity (initially from thousands to hundreds of thousands centipoise). Water-based capsules, such as those made from a protein or polysaccharide material, for example, could be dispersed in such a medium and coated, provided the viscosity could be sufficiently lowered. Curing in such systems is generally by ultraviolet radiation.

Figure 11A:
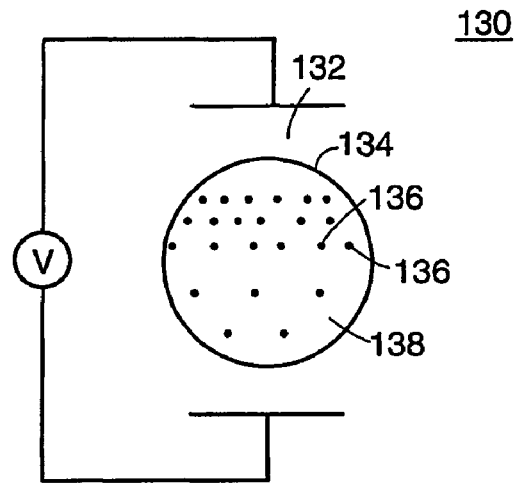
FIG. 11a shows a diagrammatic cross-sectional view of an electronic display according to one embodiment of the present invention.

Referring to FIG. 11a, an embodiment of an electrophoretic display that employs a thin-film transistor array of the present invention is shown. FIG. 11a shows a diagrammatic cross-section of an electrophoretic display 130 constructed using electronic ink. The binder 132 includes at least one capsule 134, which is filled with a plurality of particles 136 and a dyed suspending fluid 138. In one embodiment, the particles 136 are titania particles. When a direct-current electric field of the appropriate polarity is applied across the capsule 134, the particles 136 move to the viewed surface of the display and scatter light. When the applied electric field is reversed, the particles 136 move to the rear surface of the display and the viewed surface of the display then appears dark.

Figure 11B:
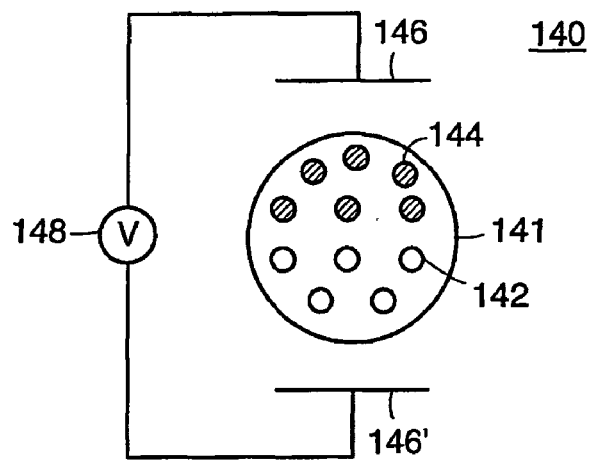
FIG. 11b shows a diagrammatic cross-sectional view of an electronic display according to one embodiment of the present invention.

FIG. 11b shows a cross-section of another electrophoretic display 140 constructed using electronic ink. This display comprises a first set of particles 142 and a second set of particles 144 in a capsule 141. The first set of particles 142 and the second set of particles 144 have contrasting optical properties. For example, the first set of particles 142 and the second set of particles 144 can have differing electrophoretic mobilities. In addition, the first set of particles 142 and the second set of particles 144 can have contrasting colors. For example, the first set of particles 142 can be white, while the second set of particles 144 can be black. The capsule 141 further includes a substantially clear fluid. The capsule 141 has electrodes 146 and 146' disposed adjacent it. The electrodes 146, 146' are connected to a source of voltage 148, which may provide an electric field to the capsule 141. In one embodiment, upon application of an electric field across the electrodes 146, 146', the first set of particles 142 move toward electrode 146', while the second set of particles 144 move toward electrode 146. In another embodiment, upon application of an electric field across the electrodes 146, 146', the first set of particles 142 move rapidly toward electrode 146', while the second set of particles 144 move only slowly or not at all towards electrode 146, so that the first set of particles packs preferentially at the microcapsule surface adjacent to electrode 146'.

Figure 11C:
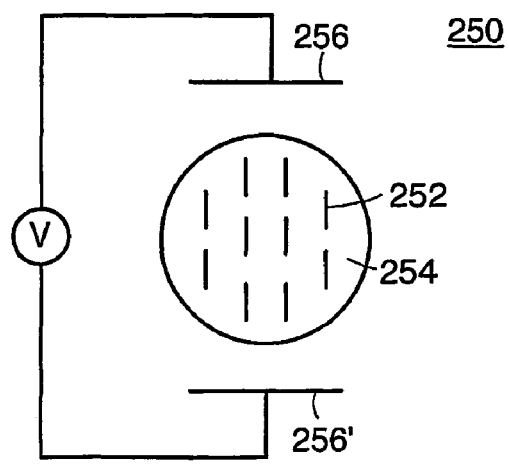
FIG. 11c shows a diagrammatic cross-sectional view of an electronic display according to one embodiment of the present invention.
Figure 11D:
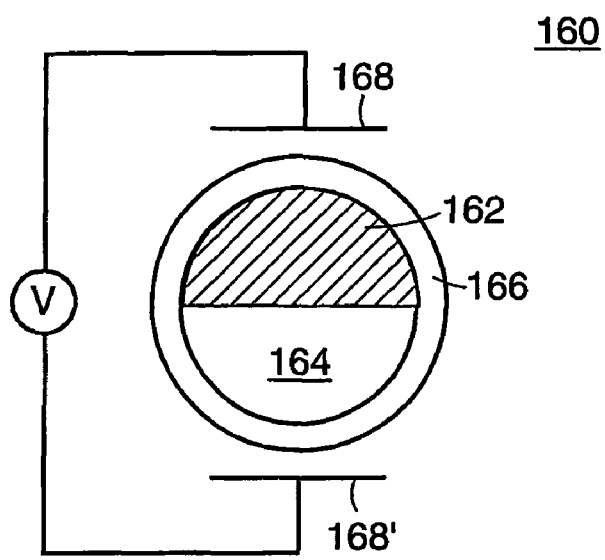
FIG. 11d shows a diagrammatic cross-sectional view of an electronic display according to one embodiment of the present invention.

FIG. 11c shows a diagrammatic cross-section of a suspended particle display 150. The suspended particle display 150 includes needle-like particles 152 in a transparent fluid 154. The particles 152 change their orientation upon application of an AC field across the electrodes 156, 156'. When the AC field is applied, the particles 152 are oriented perpendicular with respect to the display surface and the display appears transparent. When the AC field is removed, the particles 152 are randomly oriented and the display 150 appears opaque.

The electrophoretic and suspended particle displays provided in FIGS. 9a–9c are exemplary only, and other electrophoretic displays can be used in accordance with the present invention.

In another detailed embodiment, the display medium 106 can comprise a plurality of bichromal spheres shown in FIG. 1d. A bichromal sphere 160 typically comprises a positively charged hemisphere 162 of a first color and a negatively charged hemisphere 164 of a second color in a liquid medium 166. Upon application of an electric field across the sphere 160 through a pair of electrodes 168, 168', the sphere 160 rotates and displays the color of one of the two hemispheres 162, 164.

In an alternative embodiment, an array of transistors with reduced cross-talk is prepared by increasing the resistivity of the semiconductor layer. For example, where the semiconductor layer is an amorphous silicon that is slightly n-type, the semiconductor can be lightly doped with boron or an equivalent p-type dopant to increase the resistivity of the semiconductor layer. If the semiconductor layer is doped with too much boron, the semiconductor layer will become p-type and the resistivity will decrease. For example, in a display application, the boron doping can be adjusted to provide the minimum required "on" current for the transistor to drive a pixel of a display, while concurrently maintaining sufficient isolation between neighboring elements or signals. As discussed, the spacing between neighboring source and drain electrodes of the transistors and the metal signal lines must be sufficiently large to suppress charge leakage through the underlying semiconductor layer in this embodiment. This minimum spacing can be derived via a resistance calculation if the leakage current, electrode potential, semiconductor conductivity and thickness of various materials are known.

While the invention has been particularly shown and described with reference to specific preferred embodiments, it should be understood by those skilled in the art that various changes in form and detail may be made therein without departing from the spirit and scope of the invention as defined by the appended claims. For example, an array of active or passive elements can be prepared in accordance with the present invention. The array of elements can be used in devices other than displays.

What is claimed is:

1. A thin-film transistor array comprising at least first, second and third transistors, each of the transistors comprising:
   a source electrode;
   a drain electrode spaced from the source electrode;
   a semiconductor layer in electrical communication with both the source and drain electrodes; and
   a gate electrode disposed adjacent to the semiconductor layer for varying the resistance of the semiconductor layer between the source and drain electrodes by varying a potential of the gate electrode,
   the transistor array further comprising:
      a first data line in communication with one of the source and drain electrodes of each of the first and second transistors;
      a second data line in communication with a corresponding one of the source and drain electrodes of the third transistor;
      a first select line in communication with the gate electrodes of the first and third transistors; and
      a second select line in communication with the gate electrode of the second transistor,
   wherein the semiconductor layer extends continuously among the first, second and third transistors.

2. The thin-film transistor array of claim 1 wherein the semiconductor layer is unpatterned.

3. The thin-film transistor array of claim 2 further including a dielectric layer adjacent to the semiconductor layer, wherein the dielectric layer is unpatterned.

4. The thin-film transistor array of claim 1 wherein the first transistor is a bottom gate transistor.

5. The thin-film transistor array of claim 1 wherein the first transistor is a top gate transistor.

6. The thin-film transistor array of claim 1 wherein the first transistor further includes a first pixel electrode of an electronic display, the first pixel electrode in communication with the drain electrode of the first transistor, the second transistor further includes a second pixel electrode of the electronic display, the second pixel electrode in communication with the drain electrode of the second transistor, the third transistor further includes a third pixel electrode of the electronic display, the third pixel electrode in communication with the drain electrode of the third transistor, and the source electrode of the first transistor is in communication with the first data line, the source electrode of the second transistor is in communication with the second data line and the source electrode of the third transistor is in communication with the second data line.

7. The thin-film transistor array of claim 6 wherein a distance between the first pixel electrode and the first data line is selected to provide an acceptable leakage between the first pixel electrode and the first data line.

8. The thin-film transistor array of claim 6 wherein a distance between the first transistor and the second transistor is selected to provide an acceptable leakage between the first data line and the second data line.

9. The thin-film transistor array of claim 8 wherein at least one of the first data line, the second data line, the first transistor and the first pixel electrode have a geometry selected to provide an acceptable leakage between the first data line and the second data line.

10. The thin-film transistor array of claim 1 wherein the semiconductor layer comprises an organic semiconductor material.

11. The thin-film transistor array of claim 1 wherein the semiconductor layer comprises silicon.

12. The thin-film transistor array of claim 11 wherein the semiconductor layer comprises amorphous silicon.

13. The thin-film transistor array of claim 11 wherein the semiconductor layer comprises amorphous silicon with a p-type dopant.

14. The thin-film transistor array of claim 6 wherein the first transistor further comprises a patterned n-doped silicon layer provided between the semiconductor layer and at least one of the source electrode of the first transistor and the drain electrode of the first transistor.

15. The thin-film transistor array of claim 1 wherein the first transistor further comprises a passivation layer provided adjacent to the semiconductor layer.

* * * * *